United States Patent
Inoue et al.

(10) Patent No.: US 9,431,632 B2
(45) Date of Patent: Aug. 30, 2016

(54) SURFACE LIGHT SOURCE DEVICE HAVING SPECIFIC STRUCTURE; LIGHTING DEVICE AND BACKLIGHT DEVICE CONTAINING THE SAME

(71) Applicant: ZEON CORPORATION, Tokyo (JP)

(72) Inventors: Hiroyasu Inoue, Tokyo (JP); Toshihiko Hori, Tokyo (JP)

(73) Assignee: ZEON CORPORATION, Tokyo (JP)

( * ) Notice: Subject to any disclaimer, the term of this patent is extended or adjusted under 35 U.S.C. 154(b) by 0 days.

(21) Appl. No.: 14/638,567

(22) Filed: Mar. 4, 2015

(65) Prior Publication Data
US 2015/0179981 A1    Jun. 25, 2015

Related U.S. Application Data

(62) Division of application No. 13/377,017, filed as application No. PCT/JP2010/059903 on Jun. 11, 2010, now abandoned.

(30) Foreign Application Priority Data

Jun. 11, 2009 (JP) ................................. 2009-139818
Jun. 24, 2009 (JP) ................................. 2009-149944

(51) Int. Cl.
*H01L 51/52* (2006.01)
*G02B 5/04* (2006.01)
(Continued)

(52) U.S. Cl.
CPC ........... *H01L 51/5268* (2013.01); *G02B 5/045* (2013.01); *G02F 1/133603* (2013.01);
(Continued)

(58) Field of Classification Search
CPC ........... H01L 51/5268; H01L 51/5237; H01L 51/5275; G02B 5/045; G02F 1/133603
See application file for complete search history.

(56) References Cited

U.S. PATENT DOCUMENTS 7,922,358 B2    4/2011  Von Malm
2004/0240070 A1  12/2004  Suzuki et al.
(Continued)

FOREIGN PATENT DOCUMENTS

JP    8-083688 A     3/1996
JP    2002-214411    7/2002
(Continued)

OTHER PUBLICATIONS

Japanese Office Action issued in Japanese Patent Application No. 2014-234944 on Jul. 10, 2015.
(Continued)

*Primary Examiner* — Evan Pert
*Assistant Examiner* — Farid Khan
(74) *Attorney, Agent, or Firm* — Birch, Stewart, Kolasch & Birch, LLP

(57) ABSTRACT

A surface light source device is provided that has high light extraction efficiency and high mechanical strength and can suppress a change in color tone at different viewing angles. To that end, the surface light source device includes: an organic EL element including a luminescent layer; and a light-emitting surface structure layer that is disposed in contact with one of the surfaces of the organic EL element and defines a concave-convex structure on the surface on the device light-emitting surface side. The concave-convex structure includes a plurality of concave portions having oblique surfaces and flat portions disposed around the concave portions. The surface light source device further includes a diffusing member on which the light emitted from the luminescent layer is incident, the diffusing member allowing the incident light to pass therethrough or reflecting the incident light in a diffused manner.

14 Claims, 16 Drawing Sheets

(51) Int. Cl.
    *G02F 1/1335* (2006.01)
    *F21V 8/00* (2006.01)
(52) U.S. Cl.
    CPC ....... *H01L51/5237* (2013.01); *H01L 51/5275* (2013.01); *G02B 6/0036* (2013.01); *G02F 2001/133607* (2013.01)

(56) References Cited

U.S. PATENT DOCUMENTS

| | | | |
|---|---|---|---|
| 2005/0142379 A1* | 6/2005 | Juni | G02B 5/0242 428/690 |
| 2005/0162743 A1 | 7/2005 | Yano et al. | |
| 2007/0171671 A1* | 7/2007 | Kurokawa | B32B 3/30 362/606 |
| 2007/0263412 A1 | 11/2007 | Lee | |
| 2008/0305301 A1 | 12/2008 | Hsu et al. | |
| 2009/0097234 A1 | 4/2009 | Von Malm | |
| 2010/0087611 A1* | 4/2010 | Urakawa | C08G 18/3853 526/261 |
| 2010/0214507 A1* | 8/2010 | Noh | G02B 6/0031 349/64 |
| 2010/0245718 A1* | 9/2010 | Nishino | G02F 1/133514 349/65 |
| 2011/0019426 A1* | 1/2011 | Kuiseko | G02B 5/045 362/354 |
| 2011/0090568 A1 | 4/2011 | Hamamoto et al. | |
| 2011/0198987 A1* | 8/2011 | Yamada | B82Y 20/00 313/504 |

FOREIGN PATENT DOCUMENTS

| | | |
|---|---|---|
| JP | 2002-237381 A | 8/2002 |
| JP | 2003-059641 A | 2/2003 |
| JP | 2003-294948 A | 10/2003 |
| JP | 2005-011642 | 1/2005 |
| JP | 3114467 U | 10/2005 |
| JP | 2005-351956 A | 12/2005 |
| JP | 2006-528825 A | 12/2006 |
| JP | 2007-249220 A | 9/2007 |
| JP | 2008-041328 A | 2/2008 |
| JP | 2008-146886 A | 6/2008 |
| JP | 2008-197224 A | 8/2008 |
| JP | 2008-234930 A | 10/2008 |
| JP | 2009-78463 A | 4/2009 |
| JP | 2009-087938 A | 4/2009 |
| JP | 2010-146893 A | 7/2010 |
| WO | WO 2005/018010 A2 | 2/2005 |
| WO | WO 2008/020514 A1 | 2/2008 |

OTHER PUBLICATIONS

Korean Office Action issued in Korean Patent Application No. 10-2011-7028789 on Jul. 21, 2015.

International Search Report, PCT/JP2010/059903, Aug. 24, 2010.

Japanese Decision of a Patent Grant, maiied Oct. 21, 2014, for Japanese Application No. 2010-140578, with English transiatien.

Japanese Decision of a Patent Grant, mailed Oct. 7, 2014. For Japanese Application No. 2013-221570, with English translation.

Japanese Office Acton and its translation dated Apr. 1, 2014 for Japanese Application No. 2010-140578.

Japanese Office Action and its translation dated Dec. 10, 2013 for Japanese Application No. 2010-140578.

Japanese Office Action, mailed Jul. 1, 2014, for Japanese Application No. 2013-221570, with English translation.

* cited by examiner ic fields.
SURFACE LIGHT SOURCE DEVICE HAVING SPECIFIC STRUCTURE; LIGHTING DEVICE AND BACKLIGHT DEVICE CONTAINING THE SAME This application is a Divisional of copending application Ser. No. 13/377,017, filed on Dec. 8, 2011, which was filed as PCT International Application No. PCT/JP2010/059903 on Jun. 11, 2010, which claims the benefit under 35 U.S.C. §119(a) to Patent Application No. 2009-139818, filed in JAPAN on Jun. 11, 2009, and Patent Application No. 2009-149944, filed in JAPAN on Jun. 24, 2009, all of which are hereby expressly incorporated by reference into the present application.

TECHNICAL FIELD

The present invention relates to a surface light source device, a lighting device provided with the surface light source device, and a backlight device provided with the surface light source device.

BACKGROUND ART

The luminescent bodies of organic electroluminescent elements (hereinafter may be referred to as "organic EL elements") can be formed in a planar shape, and the color of light emitted therefrom can be white or a color close to white. Therefore, it is contemplated that such organic EL elements are used as light sources of lighting devices for illuminating areas in living environments etc. or in applications for backlights of display devices.

As an example of the organic EL elements used in lighting applications, white organic EL elements are being manufactured. Many of such white elements are of the stacked or tandem type in which luminescent layers that emit light with complimentary colors are stacked. The stacks of such luminescent layers are mainly stacks of yellow/blue luminescent layers or green/blue/red luminescent layers.

However, currently known organic EL elements are unsatisfactory in terms of efficacy for the aforementioned lighting applications. Therefore, when an organic EL element is used as a surface light source, it is required to improve its light extraction efficiency. For example, although the luminescent efficiency of the luminescent layer itself of an organic EL element is high, the amount of light is reduced due to, for example, interference in the layers in the stacked structure constituting the element when the light passes through the stacked structure and is emitted to the outside. Therefore, it is required to reduce such a loss of light as much as possible.

One known method for improving the light extraction efficiency of organic EL elements is to provide various structures on their light-extraction substrates. For example, it is proposed to provide prisms containing a fluorescent compound on the light-emitting surface of a light source device (Patent Document 1). It is also proposed to provide a micro-lens array on the light-emitting surface of a light source device (Patent Document 2). With these structures, light can be gathered in a favorable manner, and the efficiency is thereby improved. As another example of means for improving the light extraction efficiency of an organic EL element, Patent Document 3 discloses that a light diffusing medium is provided on the light-emitting side of the organic EL element to improve the overall brightness.

LIST OF PRIOR ART DOCUMENTS

Patent Documents

Patent Document 1: Japanese Patent Application Laid-Open No. 2002-237381 A
Patent Document 2: Japanese Patent Application Laid-Open No. 2003-59641 A
Patent Document 3: Japanese Patent Application Laid-Open No. 2006-528825 A (WO2005-18010)

SUMMARY OF THE INVENTION

Problem to be Solved by the Invention

As a result of intensive studies by the present inventors, it has been found out that, when an organic EL element is used as a surface light source device, there is another demand for a reduction in the change in color tone (color unevenness) at different viewing angles, in addition to the demand for an improvement in the light extraction efficiency described above. More specifically, the problem is that the light spectrum observed in the front direction of the light-emitting surface of the surface light source device (in the normal direction with respect to the light-emitting surface) can be different from the light spectrum observed in an oblique direction that crosses the front direction. In such a case, a change in color tone at different viewing angles occurs, and therefore the surface light source device is not always suitable as a light source. Note that a certain direction that crosses another direction means that the former direction is not parallel to the latter direction.

Such color unevenness can also occur when the structure described in any of Patent Documents 1 and 2 is adopted in a stacked-type organic EL element for lighting applications. In such a case, the color unevenness is observed as a phenomenon in which the color tone of the light-emitting surface when observed from the front is significantly different from the color tone of the light-emitting surface when observed in a direction oblique with respect to the front. This phenomenon is due to the difference in the depth from the light-emitting surface to each luminescent layer for each color.

Such a problem of color unevenness can be improved also by the technology described in Patent Document 3. However, in this case, the diffusion performance must be significantly improved. Therefore there arises a necessity to, for example, increase the amount of a diffusing agent to be added. In this case, the thickness of the diffusing layer must be increased to a maximum. This causes problems such as warpage of the product which leads to reduction in productivity. In addition, the thick diffusing layer cannot contribute to a reduction in the thickness (downsizing) of the device.

In addition, when the structure described in any of Patent Documents 1 and 2 is adopted for a stacked-type organic EL element for lighting applications and a concave-convex structure such as prisms is provided on the light-emitting surface of the light source device, the apex portions of the concave-convex structure are easily broken off, which causes difficulty in increasing the mechanical strength of the device.

The present invention has been made in view of the foregoing issues. It is a first object of the present invention to provide a surface light source device, a lighting device, and a backlight device that have high light extraction efficiency and high mechanical strength and can reduce the change in color tone at different viewing angles.

It is a second object of the present invention to provide a surface light source device that can be produced with high productivity, can contribute to a reduction in the size of devices, and can suppress the change in color tone at different viewing angles and to provide a lighting device that uses the surface light source device and a backlight device that uses the surface light source device.

Means for Solving the Problem

The present inventors have made intensive studies to solve the foregoing problems. The inventors have then found out that the first object can be achieved by giving the light-emitting surface of a surface light source device a specific structure, and providing a diffusing member in the surface light source device. The first invention has been completed based on this finding.

The present inventors have also found out that the second object can be achieved by providing both a diffusing section and a light-distribution conversion unit. The second invention has been completed based on this finding.

Accordingly, the first invention provides the following (1) to (10), (21), and (22).

(1) A surface light source device, comprising: an organic electroluminescent element including a luminescent layer; and a light-emitting surface structure layer disposed in contact with at least one of surfaces of the organic electroluminescent element, wherein:
  the light-emitting surface structure layer includes a concave-convex structure provided on a surface thereof on a side toward a light-emitting surface of the device,
  the concave-convex structure includes a plurality of concave portions having oblique surfaces and flat portions disposed around the concave portions,
  the surface light source device further comprises a diffusing member on which light emitted from the luminescent layer is incident, the diffusing member allowing the incident light to pass therethrough or reflecting the incident light in a diffused manner, and
  the surface light source device includes the diffusing member as a member that constitutes at least one of:
  a layer constituting all or part of the light-emitting surface structure layer, and
  a layer disposed at a position farther from the light-emitting surface structure layer than the organic electroluminescent element.

(2) The aforementioned surface light source device, wherein the diffusing member is a member provided as the layer constituting all or part of the light-emitting surface structure layer, and is a member that allows the incident light to pass therethrough in a diffused manner.

(3) The aforementioned surface light source device, wherein the diffusing member is a bonding layer interposed between two layers included in the light-emitting surface structure layer.

(4) The aforementioned surface light source device, wherein the light-emitting surface structure layer includes:
  a substrate disposed in contact with the organic electroluminescent element,
  a concave-convex structure layer disposed at a position closer to the device light-emitting surface than the substrate, the concave-convex structure layer including the concave-convex structure on a surface thereof, the surface being on a side close to the device light-emitting surface, and
  a bonding layer for bonding the substrate and the concave-convex structure layer, and wherein:
  the surface light source device includes the bonding layer as the diffusing member.

(5) The aforementioned surface light source device, wherein the diffusing member is formed from a material containing particles that impart light diffusibility.

(6) The aforementioned surface light source device, wherein the diffusing member is a member disposed at a position farther from the light-emitting surface structure layer than the organic electroluminescent element, and is a member that reflects the incident light in a diffused manner.

(7) The aforementioned surface light source device, wherein, when the concave-convex structure is observed in a direction perpendicular to the device light-emitting surface, a ratio of an area occupied by the flat portions relative to the sum of the area occupied by the flat portions and an area occupied by the concave portions is 10 to 75%.

(8) The aforementioned surface light source device, wherein the concave portions have a pyramid shape, a conical shape, a shape of part of a sphere, or a shape of a combination thereof,
  the plurality of concave portions are aligned on the device light-emitting surface in two or more directions crossing each other, and
  spacings are provided between adjacent concave portions in all of the two or more directions, the spacings constituting the flat portions.

(9) The aforementioned surface light source device, wherein the concave portions have a pyramid shape, a conical shape, a shape of part of a sphere, or a shape of a combination thereof,
  the plurality of concave portions are aligned on the device light-emitting surface in two or more directions crossing each other, and
  spacings are provided between adjacent concave portions in only one of the two or more directions, the spacings constituting the flat portions.

(10) The aforementioned surface light source device, wherein the concave portions have a groove shape, the plurality of concave portions are aligned in parallel to each other on the device light-emitting surface, and
  spacings are provided between adjacent concave portions, the spacings constituting the flat portions.

(21) A lighting device comprising the surface light source device according to any one of (1) to (10).

(22) A backlight device comprising the surface light source device according to any one of (1) to (10).

The second invention provides the following inventions.

(11) A surface light source device, comprising: an organic electroluminescent element including, in the following order, a first electrode layer, a luminescent layer, and a second electrode layer; and a light-emitting-side member that is disposed in contact with at least one of surfaces of the organic electroluminescent element and has a light-emitting surface from which light is emitted to the outside, wherein:
  the light-emitting-side member includes:
  a light-distribution conversion unit that converts a distribution of light emitted from the organic electroluminescent element so as to reduce a difference between a chromaticity of light emitted from the light-emitting surface in a normal direction with respect to the light-emitting surface and a chromaticity of light emitted from the light-emitting surface in an oblique direction crossing the normal direction, and a diffusing section that diffuses the light emitted from the organic electroluminescent element.

(12) The aforementioned surface light source device, wherein the diffusing section is a layer that is disposed between the light-distribution conversion unit and the organic electroluminescent element and is formed of a composition containing particles that impart light diffusibility.

(13) The aforementioned surface light source device, wherein the diffusing section is a layer that is disposed on a light-emitting side of the light-distribution conversion unit and is formed of a composition containing particles that impart light diffusibility.

(14) The aforementioned surface light source device, wherein the light-distribution conversion unit includes a concave-convex structure layer having a concave-convex structure formed on a surface thereof.

(15) The aforementioned surface light source device, wherein the concave-convex structure layer is formed of a composition containing particles that impart light diffusibility and serves also as the diffusing section.

(16) The aforementioned surface light source device, wherein the light-distribution conversion unit includes a substrate and a concave-convex structure layer disposed on a surface of the substrate, the concave-convex structure layer having a concave-convex structure formed on a surface thereof on a side opposite to the substrate.

(17) The aforementioned surface light source device, wherein the substrate and/or the concave-convex structure layer is formed of a composition containing particles that impart light diffusibility and serves also as the diffusing section.

(18) The aforementioned surface light source device, wherein the light-distribution conversion unit includes a substrate film and a selective reflecting layer disposed on at least one of surfaces of the substrate film.

(19) The aforementioned surface light source device, wherein the selective reflecting layer includes a layer containing a resin having cholesteric regularity.

(20) The aforementioned surface light source device, wherein the substrate film is formed of a composition containing particles that impart light diffusibility and serves also as the diffusing section.

(21) A lighting device comprising the aforementioned surface light source device.

(22) A backlight device comprising the aforementioned surface light source device.

Effect of the Invention

The surface light source device of the first invention has high light extraction efficiency and can reduce the change in color tone at different viewing angles, and the light-emitting surface of the device has high mechanical strength. Therefore, the surface light source device is useful as the light source of a lighting device and the backlight of a display device such as a liquid crystal display device.

The lighting device and backlight device of the first invention include the surface light source device of the first invention. Therefore, the lighting device and the backlight device can have high light extraction efficiency and high mechanical strength and can reduce the change in color tone at different viewing angles.

The surface light source device of the second invention has advantages in that it can be produced with high productivity because problems such as warpage of the product do not occur, can contribute to a reduction in the size of the device, and can suppress the change in color tone at different viewing angles. Since the surface light source device has such advantages, it is useful as the light source of a lighting device and the backlight device for a liquid crystal display device.

DESCRIPTION OF EMBODIMENTS

[I. Description of First Invention]

The first invention will be described in detail by way of embodiments and exemplifications. However, the first invention is not limited to the following embodiments and exemplifications.

<Embodiment 1-1>

The first invention will be described in more detail with reference to the drawings.

A surface light source device of the first invention includes: an organic EL element including a luminescent layer; and a light-emitting surface structure layer that is disposed in contact with at least one surface of the organic EL element and defines a concave-convex structure on the surface on the device light-emitting surface side.

The device light-emitting surface is the light-emitting surface of the surface light source device, i.e., the light-emitting surface from which the light from the surface light source device is emitted to the outside of the device. The device light-emitting surface is a surface parallel to the luminescent layer of the organic EL element and is parallel to the principal surface of the surface light source device. However, in a microscopic sense, the surfaces of concave portions described later may form a non-parallel angle with respect to the luminescent layer. Hereinafter, unless otherwise specifically mentioned, the phrase "parallel (or perpendicular) to the device light-emitting surface" simply means that an object is parallel (or perpendicular) to the device light-emitting surface with the concave portions being neglected. Unless otherwise mentioned, a description will be given of the surface light source device placed with its device light-emitting surface being parallel to the horizontal direction and facing upward.

In the first invention, when components are "parallel" or "perpendicular" to each other, a deviation in the range in which the effects of the first invention are not impaired may be present. For example, a tolerance of ±5° with respect to the parallel or perpendicular angle may be allowable.

Figure 1:
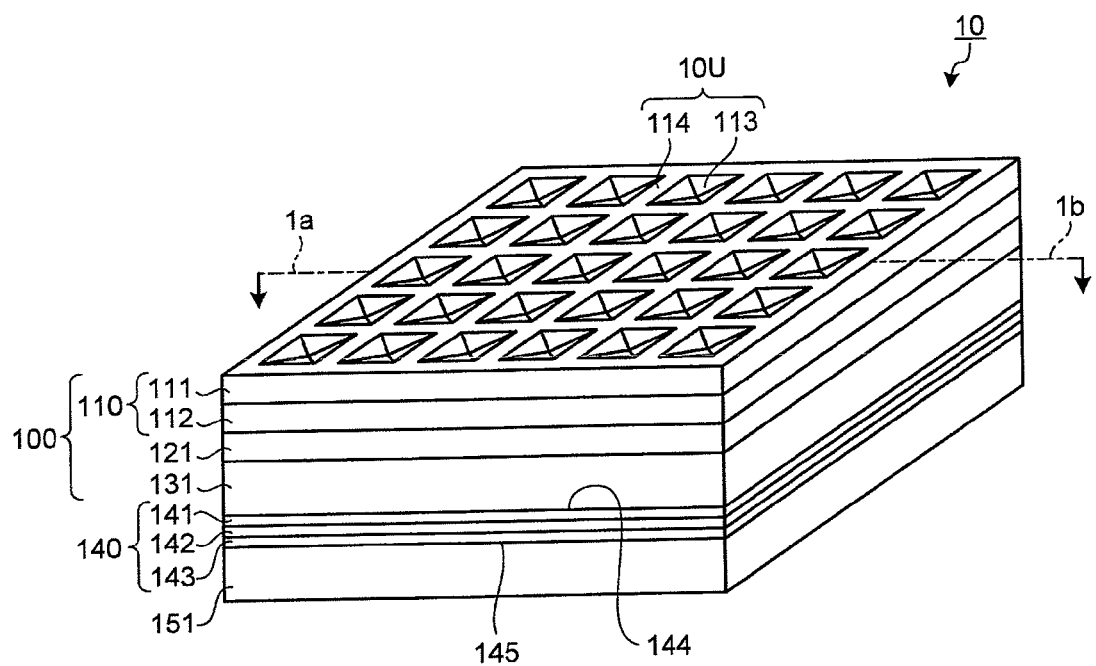
FIG. 1 is a perspective view schematically showing a surface light source device according to Embodiment 1-1.
Figure 2:
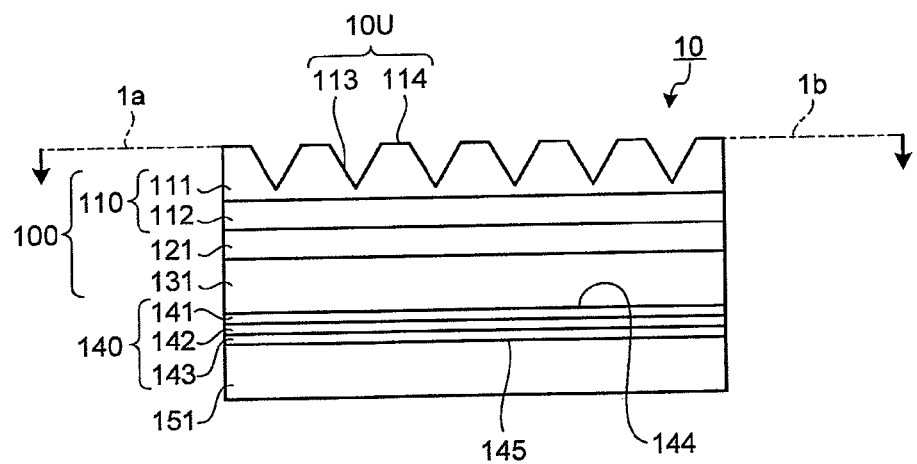
FIG. 2 is a cross-sectional view showing a cross-section obtained by cutting the surface light source device shown in FIG. 1 along a plane that passes through line 1a-1b in FIG. 1 and is perpendicular to a device light-emitting surface.

Embodiment 1-1 is a first embodiment of the first invention. FIG. 1 is a perspective view schematically showing the surface light source device according to Embodiment 1-1. In Embodiment 1-1, the surface light source device 10 is a device including a device light-emitting surface 10U and having a flat rectangular plate-like structure. FIG. 2 is a cross-sectional view showing a cross-section obtained by cutting the surface light source device 10 shown in FIG. 1 along a plane that passes through line 1a-1b in FIG. 1 and is perpendicular to the device light-emitting surface.

The surface light source device 10 includes an organic EL element 140 and a light-emitting surface structure layer 100 disposed in contact with a surface 144 of the organic EL element 140. The surface 144 is toward the device light-emitting surface 10U. The surface light source device 10 further includes, as an optional component, a sealing substrate 151 disposed on a surface 145 of the organic EL element 140. The surface 145 is on the side opposite to the device light-emitting surface 10U. Although not shown in the figures, any optional material such as a filler or an adhesive agent may be present between the surface 145 and the sealing substrate 151. A gap may also be present therebetween. In the gap, air or any other gas may be present so long as a problem such as significant deterioration of the durability of a luminescent layer 142 does not occur. Alternatively, the gap may be a vacuum gap.

The organic EL element 140 includes a first electrode layer 141, a luminescent layer 142, and a second electrode layer 143. In the Embodiment 1-1, the first electrode layer 141 is a transparent electrode, and the second electrode layer 143 is a reflecting electrode. With this configuration, the light from the luminescent layer 142 passes through the first electrode layer 141, or is reflected on the second electrode layer 143 and then passes through the luminescent layer 142 and the first electrode layer 141, whereby the light can be directed toward the light-emitting surface structure layer 100.

The light-emitting surface structure layer 100 includes: a multi-layered body 110 including a concave-convex structure layer 111 and a substrate film layer 112; a glass substrate 131 serving as a substrate and disposed in contact with the organic EL element 140; and a bonding layer 121 that bonds the multi-layered body 110 to the glass substrate 131. In the surface light source device 10, one or more of the concave-convex structure layer 111, the substrate film layer 112, the bonding layer 121, and the glass substrate 131 are formed of a material containing a diffusing agent (particles that impart light diffusibility). This configuration thus constitutes a diffusing member that allows the incident light to pass therethrough or reflects the incident light in a diffused manner, wherein the incident light is a light that has been emitted (this emission is also referred to as discharge) from the luminescent layer 142 and incident on the diffusing member. In the configuration of the present embodiment, the organic EL element 140 is in direct contact with the glass substrate 131. However, another layer such as a diffusing layer may be interposed therebetween.

The concave-convex structure layer 111 is located at the top surface of the surface light source device 10 (i.e., the outermost layer of the surface light source device 10 that is on the light-emitting surface side). Therefore, the concave-convex structure layer 111 is disposed at a position closer to the device light-emitting surface 10U than the glass substrate 131. In addition, the concave-convex structure layer 111 has a concave-convex structure provided on its surface that is on the side close to the device light-emitting surface 10U. The concave-convex structure includes a plurality of concave portions 113 and flat portions 114 disposed around the concave portions 113. In the present embodiment, the surface of the concave-convex structure layer 111 that is on the side close to the device light-emitting surface 10U is indeed the device light-emitting surface 10U. Therefore, the concave-convex structure defines the device light-emitting surface 10U. In a macroscopic sense, i.e., with the concave portions 113 being neglected, the device light-emitting surface 10U is a flat surface parallel to other layers, such as the flat portions 114 and the glass substrate 131, in the device. However, in a microscopic sense, the device light-emitting surface 10U is a concave-convex surface including oblique surfaces defined by the concave portions 113. In the present application, the figures are schematic diagrams, and illustrate only a small number of concave portions on the device light-emitting surface. However, in an actual device, a much larger number of concave portions may be provided on one device light-emitting surface.

(Organic EL Element)

In the first invention, the organic EL element may be an element including two or more electrode layers and a luminescent layer that is disposed between these electrode layers and emits light when a voltage is applied from the electrodes, as exemplified as the organic EL element 140.

Generally, an organic EL element has a structure in which electrodes and layers such as a luminescent layer that constitute the element are formed on a substrate and a sealing member that covers these layers is then provided so that the layers such as the luminescent layer are sealed with the substrate and the sealing member. Generally, a device that emits light from its substrate side is referred to as a bottom emission type, and a device that emits light from its sealing member side is referred to as a top emission type. The surface light source device of the first invention may be any of the top emission type and the bottom emission type. When the surface light source device is of the bottom emission type, a combination including a substrate used to form layers and, if necessary, an optional layer forms the light-emitting surface structure layer. When the surface light source device is of the top emission type, a combination including a structural member on the light-emitting surface side, such as the sealing member, and, if necessary, an optional layer constitutes the light-emitting surface structure layer.

In the first invention, no particular limitation is imposed on the luminescent layer constituting the organic EL element, and any of the known luminescent layers may be suitably selected. The number of types of luminescent materials in the luminescent layer is not limited to one, and also the number of luminescent layers is not limited to one. In order to adapt to the use of the device as a light source, the luminescent layer may be a single layer or a combination of a plurality of layers. In this manner, white light or light of a color close to white can be emitted.

In addition to the luminescent layer, the organic EL element may further include another layer such as a hole injection layer, a hole transport layer, an electron transport layer, an electron injection layer, and a gas barrier layer that are disposed between the electrodes. The organic EL element may further include any optional components such as wiring leads for supplying an electric current to the electrodes and a peripheral structure for sealing the luminescent layer.

No particular limitation is imposed on the electrodes of the organic EL element, and any of the known electrodes may be appropriately selected. As in the organic EL element 140 in Embodiment 1-1, when a transparent electrode is employed as the electrode on a side toward the light-emitting surface structure layer and a reflecting layer is employed as the electrode on the opposite side, the organic EL element may be configured to emit light toward the light-emitting surface structure layer. When transparent electrode layers are employed as both the electrodes and a reflecting member or a scattering member (such as a white scattering member disposed through an air layer) is provided on the side opposite to the light-emitting surface structure layer, light emission toward the light-emitting surface structure layer may be achieved.

No particular limitation is imposed on the materials for forming the electrode layers and the layers disposed therebetween. Specific examples of such materials are as follows.

Examples of the material for the transparent electrode may include ITO.

Examples of the material for the hole injection layer may include starburst aromatic diamine compounds.

Examples of the material for the hole transport layer may include triphenyldiamine derivatives.

Examples of the host material for a yellow luminescent layer may also include triphenyldiamine derivatives. Examples of the dopant material for the yellow luminescent layer may include tetracene derivatives.

Examples of the material for a green luminescent layer may include pyrazoline derivatives.

Examples of the host material for a blue luminescent layer may include anthracene derivatives, and examples of the dopant material for the blue luminescent layer may include perylene derivatives.

Examples of the material for a red luminescent layer may include europium complexes.

Examples of the material for the electron transport layer may include aluminum quinoline complexes (Alq). Examples of the material for a cathode may include a stack of lithium fluoride and aluminum layers that is produced by sequential vacuum deposition.

The aforementioned luminescent layer and other luminescent layers may be suitably combined to obtain a stacked or tandem type luminescent layer that generates light with complementary colors. The combination of complementary colors may be yellow/blue, green/blue/red, etc.

(Light-Emitting Surface Structure Layer)

In the first invention, the light-emitting surface structure layer may be composed of a plurality of layers, as exemplified as the light-emitting surface structure layer 100, but may also be composed of a single layer. It is preferable, from the viewpoint of easily obtaining a light-emitting surface structure layer having the desired characteristics, to use a plurality of layers. For example, as in the light-emitting surface structure layer 100, the multi-layered body including a combination of the concave-convex structure layer and the substrate film layer may be used. In this manner, a high-performance light-emitting surface structure layer can be easily obtained.

The resin composition constituting the concave-convex structure layer and the substrate film may be a composition containing a transparent resin. The term "transparent" in the transparent resin means that it has a light transmittance suitable for use as an optical member. In the first invention, each of the layers constituting the light-emitting surface structure layer may have a light transmittance suitable for use as an optical member, and the total light transmittance of the light-emitting surface structure layer as a whole may be 80% or larger.

No particular limitation is imposed on the types of the transparent resins contained in the resin compositions. Any of various resins that can form a transparent layer may be used therefor. Examples of such a resin may include thermoplastic resins, thermosetting resins, ultraviolet curable resins, and electron ray-curable resins. Of these, thermoplastic resins can be easily deformed by heat, and ultraviolet curable resins have high curability and high efficiency. Therefore, these resins are preferred because the concave-convex structure layer can be efficiently formed. Examples of the thermoplastic resins may include polyester-, polyacrylate-, and cycloolefin polymer-based resins. Examples of the ultraviolet curable resins may include epoxy-, acrylic-, urethane-, ene/thiol-, and isocyanate-based resins. Resins having a plurality of polymerizable functional groups may be preferably used as the aforementioned resins.

As the material for the concave-convex structure layer included in the multi-layered body, a material having high hardness after curing is preferred because such a material can easily form the concave-convex structure of the device light-emitting surface and can easily provide abrasion resistance of the concave-convex structure. More specifically, it is preferable to use a material having a pencil hardness of HB or higher when a resin layer having a thickness of 7 μm is formed on a substrate with no concave-convex structure provided thereon. A material having a pencil hardness of H or higher is more preferred, and a material having a pencil hardness of 2H or higher is still more preferred. As the material for the substrate film layer, it is preferable to use a material having some degree of flexibility, because thereby handling of the multi-layered body can be facilitated during the formation of the concave-convex structure layer and/or after completing the formation of the multi-layered body. Use of a combination of the aforementioned materials results in production of a multi-layered body that can be handled easily and that has high durability, whereby a high-performance surface light source device can be easily manufactured. Such a combination of materials may be obtained by appropriately selecting, as the resins contained in the materials, the transparent resins exemplified above. More specifically, a ultraviolet curable resin such as acrylate may be used as the transparent resin constituting the material for the concave-convex structure layer, and a film made of an alicyclic olefin polymer (such as ZEONOR Film which will be described later) or a polyester film may be used as the transparent resin constituting the material for the substrate film. A preferred combination of materials may thereby be obtained.

When the light-emitting surface structure layer includes a concave-convex structure layer and a substrate film layer as in the light-emitting surface structure layer 100, the refractive indexes of the concave-convex structure layer and the substrate film may be as close to each other as possible. In such a case, the difference in refractive index is preferably 0.1 or smaller and more preferably 0.05 or smaller.

When any of the layers used as the components of the light-emitting surface structure layer, such as the concave-convex structure layer and the substrate film layer, serves as the diffusing member, the resin composition used as the material for such a layer may contain a component that can impart light diffusibility, such as particles that will be described later. If necessary, the resin composition may contain any optional components. Examples of such optional components may include additives such as antidegradants such as phenol-based and amine-based antidegradants; antistatic agents such as surfactant-based and siloxane-based antistatic agents; and light-proofing agents such as triazole-based and 2-hydroxybenzophenone-based light-proofing agents.

In the first invention, no particular limitation is imposed on the thickness of the concave-convex structure layer, but the thickness is preferably 1 to 70 μm. The thickness of the concave-convex structure layer is the distance between its surface on the substrate side on which the concave-convex structure is not formed and the flat portions of the concave-convex structure. The thickness of the substrate film layer is preferably 20 to 300 μm.

In the first invention, the light-emitting surface structure layer may further include a substrate such as the glass substrate 131 in the light-emitting surface structure layer 100 described above. Having such a substrate, the surface light source device may have stiffness for suppressing warpage. When a substrate having a good ability to seal the organic EL element and easily allowing successive formation of the layers constituting the organic EL element on the substrate in the production process is used as the aforementioned substrate, the durability of the surface light source device can be improved, and the manufacture of the surface light source device can be facilitated.

Examples of the material constituting the substrate may include, in addition to glass, resins. No particular limitation is imposed on the refractive index of the substrate. The refractive index may be 1.4 to 2.0. In the first invention, no particular limitation is imposed on the thickness of the substrate. The thickness is preferably 0.1 to 5 mm.

The light-emitting surface structure layer may further include a bonding layer interposed between two layers in the light-emitting surface structure layer such as between the multi-layered body and the substrate. An adhesive agent used as the material for the bonding layer is not limited to an adhesive agent in a narrow sense (a so-called hot-melt adhesive agent having a shear storage modulus at 23° C. of 1 to 500 MPa and exhibiting no adhesion at room temperature) but also encompasses a tacky agent having a shear storage modulus at 23° C. of smaller than 1 MPa. Specifically, an adhesive agent having a refractive index close to those of the substrate and the transparent resin layer and having transparency may be appropriately used. More specific examples may include acrylic-based adhesive agents or acrylic-based tacky agents. Preferably, the thickness of the bonding layer is 5 to 100 μm.

(Diffusing Member)

The surface light source device of the first invention further includes a diffusing member for allowing the incident light to pass therethrough in a diffused manner or reflecting the incident light in a diffused manner. The diffusing member may be provided as a layer that constitutes all or part of the light-emitting surface structure layer, as a member disposed at a position farther from the light-emitting surface structure layer than the organic EL element, or as both of them. More specifically, in the first invention, all or part of the light-emitting surface structure layer may have the function of a diffusing member, or a diffusing member may be provided as a member different from the light-emitting surface structure layer.

When one of the electrode layers of the organic EL element is a reflecting electrode and the other is a transparent electrode as in the surface light source device 10 in Embodiment 1-1, the diffusing member may be a member that is provided as a layer constituting all or part of the light-emitting surface structure layer and that allows the incident light to pass therethrough in a diffused manner. More specifically, all or part of the layers constituting the light-emitting surface structure layer, such as the concave-convex structure layer, the substrate film, the bonding layer, the glass substrate, etc. that can form the light-emitting surface structure layer, may be formed as layers that diffuse light. In this manner, all or part of these layers can serve as the diffusing member.

Examples of the material for the layer that diffuses light may include materials containing particles and alloy resin materials having light diffusibility that are prepared by mixing two or more resins. In terms of facilitating control of light diffusibility, a material containing particles is preferred, and a resin composition containing particles is particularly preferred. In these cases, since the particles serves to impart light diffusibility, the composition containing such particles has light diffusibility.

The particles contained in the diffusing member may be transparent or opaque. The material of the particle may be metals, metal compounds, and resins. Examples of the metal compounds may include oxides and nitrides of metals. Specific examples of the metals and metal compounds may include metals having high reflectivity such as silver and aluminum, and metal compounds such as silicon oxide, aluminum oxide, zirconium oxide, silicon nitride, tin-doped indium oxide, and titanium oxide. Examples of the resins may include methacrylic resins, polyurethane resins, and silicone resins.

The shape of the particles may be a spherical, cylindrical, cubic, rectangular prism, pyramid, conical, or star shape.

In the diffusing member, the ratio of the volume of the particles relative to the total volume of the materials constituting the diffusing member is preferably 1 to 80% and more preferably 5 to 50%. When the ratio of the particles is equal to or larger than the aforementioned lower limit, the desired effects such as a reduction in the change in color tone at different viewing angles can be obtained. When the volume ratio is equal to or smaller than the aforementioned upper limit, the aggregation of the particles in the diffusing member can be prevented, so that a diffusing member in which the particles are favorably dispersed can be easily obtained.

The diameter of the particles is preferably 0.1 μm or larger and 10 μm or smaller and more preferably 5 μm or smaller. The diameter of the particles is a 50% particle diameter in the cumulative distribution of the volume of the particles with the particle size plotted on the horizontal axis. The larger the particle diameter, the smaller the amount of the particles necessary to obtain the desired effects. The smaller the particle diameter, the smaller the necessary amount of the particles. Therefore, the smaller the particle diameter, the smaller the amount of particles necessary to obtained the desired effects such as a reduction in the change in color tone at different viewing angles and an improvement in light extraction efficiency. When the particles have a shape other than a spherical shape, the diameters of spheres having volumes equal to the volumes of the particles are considered as the diameters of the particles.

When the particles are transparent and are contained in a transparent resin, the difference in refractive index between the particles and the transparent resin is preferably 0.05 to 0.5 and more preferably 0.07 to 0.5. The refractive index of the particles may be larger than or smaller than the refractive index of the transparent resin. When the refractive index of the particles is too close to that of the transparent resin, the diffusing effect may not be obtained, so that color tone unevenness is not suppressed. When the difference in refractive index is too large, although the degree of diffusion becomes high and therefore the color tone unevenness is suppressed, the light extraction effect may be reduced.

When all or part of the layers constituting the light-emitting surface structure layer are formed as the diffusing member, there is no particular limitation as to which of the layers constituting the light-emitting surface structure layer is used as the diffusing member. The selection may be made from various points of view. For example, it is preferable, from the viewpoint of facilitating adjustment of the degree of diffusion, to use a layer containing a transparent resin as the diffusing member.

It is also preferable to use a layer having a certain degree of thickness (e.g., 5 μm or larger) as the diffusing member, from the viewpoint of ensuring sufficient light diffusibility without using an excessively large amount of particles in such a layer.

Preferably, the concave-convex structure layer is formed of a material having high hardness, as described above. However, when the thickness of the high-hardness material layer used in the surface light source device is large, undesirable warpage of the device light-emitting surface may occur with the lapse of time. Therefore, from this point of view, it is preferable to use, as the diffusing member, a layer that is other than the concave-convex structure layer and has properties that facilitate plastic deformation, examples of which may be the substrate film and the bonding layer.

When a layer that is produced by a process that does not include a step of heating the material thereof (for example, a transparent resin) is used as the diffusing member, the production process can be easily managed. For example, a problem such as clogging of a resin conveying passage with particles can be easily addressed. From this point of view, it is preferable to use the bonding layer as the diffusing member. It is also preferable to use the bonding layer and a layer other than the bonding layer as the diffusing members. For example, when the bonding layer and the substrate film are used as the diffusing members and the ratio of the particles added to the substrate film is reduced, the process of producing the substrate film can be easily managed (for example, the frequency of occurrence of clogging can be reduced).

An additional layer other than the concave-convex structure layer, the substrate film layer, the bonding layer, and the glass substrate may be provided in the light-emitting surface structure layer, and the additional layer may be used as the diffusing member. For example, such an additional layer may be formed between the concave-convex structure layer and the substrate film layer, between the bonding layer and the glass substrate, or on the surface of the glass substrate that is toward the luminescent layer (for example, between the glass substrate and an electrode layer of the luminescent layer). Alternatively, the additional layer and one or more of the concave-convex structure layer, the substrate film layer, the bonding layer, and the glass substrate may be used as the diffusing members.

When the diffusing member is provided as a layer constituting all or part of the light-emitting surface structure layer, no particular limitation is imposed on the degree of diffusion. However, for example, when all or part of the layers from the concave-convex structure layer to the bonding layer serve as the diffusing members, the total light transmittance of the layers from the concave-convex structure layer to the bonding layer wherein the concave-convex surface structure of the concave-convex structure layer is not formed is preferably 70 to 95% and more preferably 75 to 90%.

No particular limitation is imposed on the refractive index of the diffusing member. The refractive index is preferably 1.45 to 2, more preferably 1.6 to 2, and still more preferably 1.7 to 2. It is preferable that the refractive index of any layer on the light-emitting side of the diffusing member is smaller than the refractive index of the diffusing member. When the diffusing member has a large refractive index as described above, the range of selection of the refractive index of any layer on the light-emitting side of the diffusing member is widened, and therefore the material for such a layer may be more freely selected.

(Concave-Convex Structure)

In the first invention, the concave-convex structure on the light-emitting surface structure layer includes a plurality of concave portions including oblique surfaces and flat portions disposed around the concave portions. The "oblique surface" is a surface forming a non-parallel angle with respect to the device light-emitting surface. The surfaces of the flat portions may be parallel to the device light-emitting surface.

Figure 3:
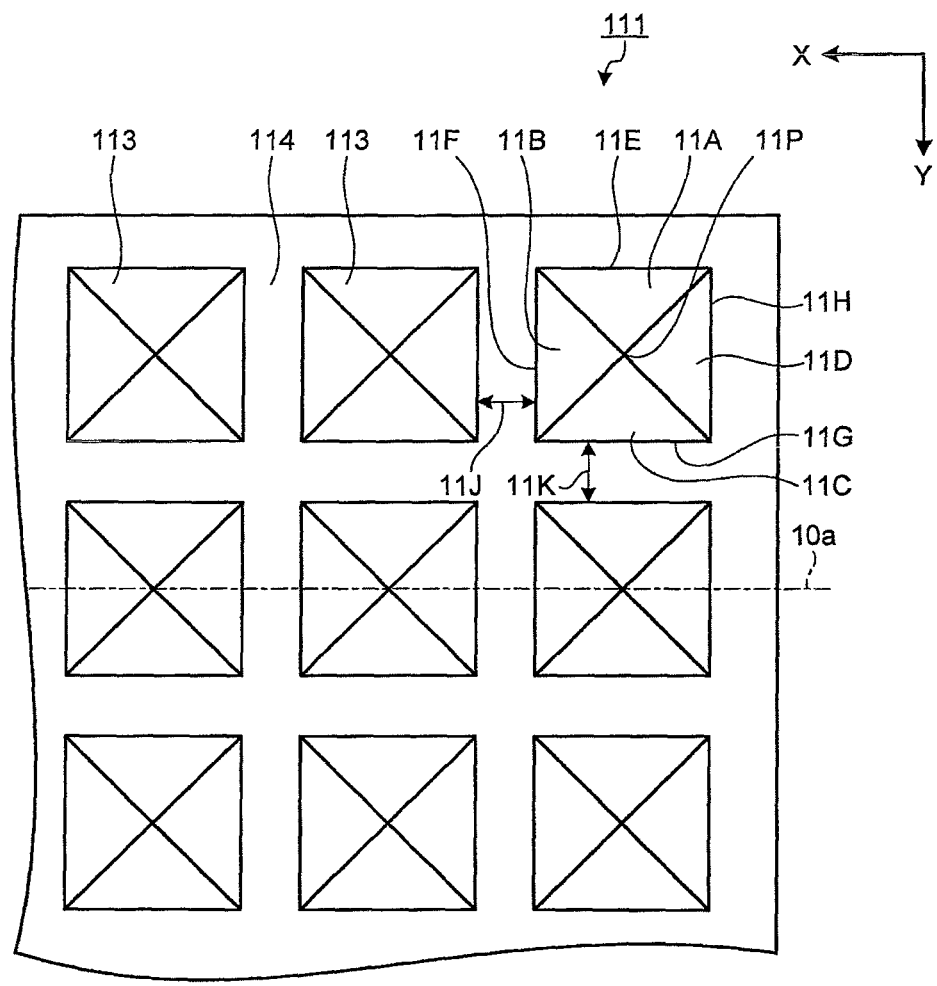
FIG. 3 is an enlarged partial top view showing the structure of the device light-emitting surface 10U of the surface light source device 10 shown in FIG. 1.
Figure 4:
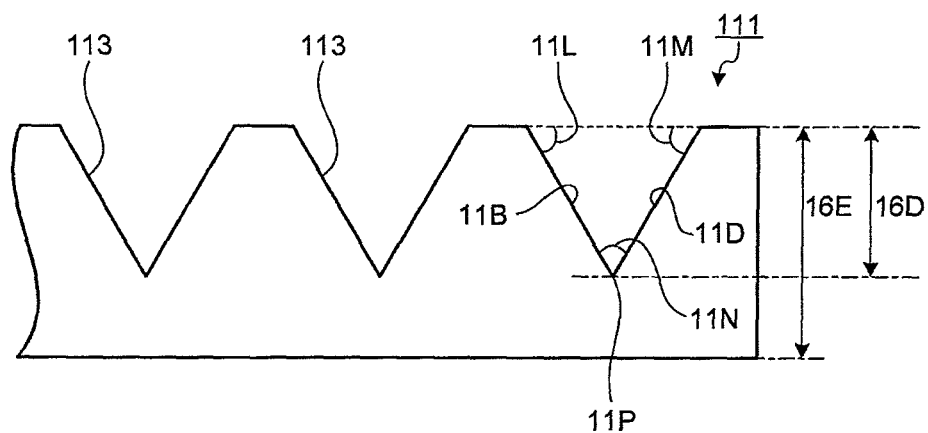
FIG. 4 is a partial cross-sectional view showing a cross-section obtained by cutting a concave-convex structure layer 111 shown in FIG. 3 along a vertical plane passing through line 10a in FIG. 3.

As an example of the concave-convex structure, the concave-convex structure on the device light-emitting surface of the surface light source device 10 shown in FIGS. 1 and 2 will be described in detail with reference to FIGS. 3 and 4. FIG. 3 is an enlarged partial top view illustrating the structure of the device light-emitting surface 10U of the surface light source device 10 that is defined by the concave-convex structure layer 111. FIG. 4 is a partial cross-sectional view showing a cross-section obtained by cutting the concave-convex structure layer 111 shown in FIG. 3 along a vertical plane that passes through line 10a in FIG. 3.

Each of the plurality of concave portions 113 is a regular quadrangular pyramid-shaped recess. Therefore, oblique surfaces 11A to 11D of the concave portion 113 have the same shape, and the base edges 11E to 11H form a square. The line 10a is a line passing through all the apexes 11P of a row of concave portions 113 and parallel to the base edges 11E and 11G of the concave portions 113.

The concave portions 113 are continuously aligned at regular intervals in two mutually orthogonal alignment directions. One direction X of the two arrangement directions is parallel to the base edges 11E and 11G. In the direction X, a plurality of concave portions 113 are aligned with a constant spacing 11J therebetween. The other direction Y of the two alignment directions is parallel to the base edges 11F and 11H. Also in the direction Y, a plurality of concave portions 113 are aligned with a constant spacing 11K therebetween.

The angles between a flat portion 114 and each of the oblique surfaces 11A to 11D constituting a concave portion 113 (angles 11L and 11M shown in FIG. 4 for the oblique surfaces 11B and 11D, respectively) are set to, for example, 60°. Therefore, the vertex angle of the regular quadrangular pyramid constituting the concave portion 113, i.e., the angle at the apex 11P formed by oblique surfaces facing each other (an angle 11N shown in FIG. 4 for the angle formed by the oblique surfaces 11B and 11D) is also 60°.

As described above, the surface light source device has a structure including, on the device light-emitting surface, a plurality of concave portions and flat portions disposed therearound and includes a predetermined diffusing member in combination with the aforementioned structure. This can improve the light extraction efficiency and can reduce the change in color tone at different viewing angles. In addition, these features can prevent the concave-convex structure from, for example, being broken off by an external impact, and therefore the mechanical strength of the device light-emitting surface can be improved.

Since the surface light source device of the first invention has the aforementioned features, variations in at least one of x- and y-chromaticity coordinates in all directions in a hemisphere on the light-emitting surface can be reduced, for example, by half as compared to those which does not have the aforementioned features. Therefore, in the surface light source device, the change in color tone at different viewing angles can be suppressed. To measure the variations in chromaticity in all directions in the hemisphere, for example, a spectral radiance meter is placed on the normal direction with respect to (placed in front of) the device light-emitting surface, and a mechanism for rotating the device light-emitting surface from −90 to 90° with respect to the direction of the normal being defined as 0° is provided. In this manner, the emission spectra can be measured in various directions to calculate the chromaticity coordinates, and the variations in the chromaticity coordinates can thereby be calculated.

The light extraction efficiency of the surface light source device can be improved by appropriately adjusting the ratio of the area occupied by the flat portions relative to the sum of the area occupied by the flat portions and the area occupied by the concave portions when the concave-convex structure layer is observed in a direction perpendicular to the device light-emitting surface (hereinafter this ratio is referred to as a "flat portion ratio"). More specifically, when the flat portion ratio is adjusted to 10 to 75%, favorable light extraction efficiency can be obtained, and the mechanical strength of the device light-emitting surface can be improved.

In the first invention, the concave portions may have, in addition to the pyramid shape described above, for example, a conical shape, a shape of part of a sphere, a groove shape, or a combination of any of the aforementioned shapes. The pyramid shape may be a quadrangular pyramid shape with a square bottom, as exemplified as the concave portions 113 described above, but the present invention is not limited thereto. The pyramid shape may be any of triangular, pentagonal, and hexagonal pyramid shapes and quadrangular pyramid shapes with non-square bottoms.

The terms cone and pyramid used in the present application encompass not only ordinary conical and pyramid shapes having a sharp apex but also conical and pyramid shapes having rounded apexes and conical and pyramid shapes having flat truncated apexes (such as frustum shapes). For example, although the apexes 11P of the quadrangular pyramids are sharp in the concave portions 113 shown in FIG. 4, the apexes of the quadrangular pyramids may have a rounded shape as in an apex 61P of a concave portion 613 shown in FIG. 5. As exemplified by concave portions 713 shown in FIG. 6, a flat portion 71P may be provided at the apex of each pyramid to form a flat truncated shape.

Figure 5:
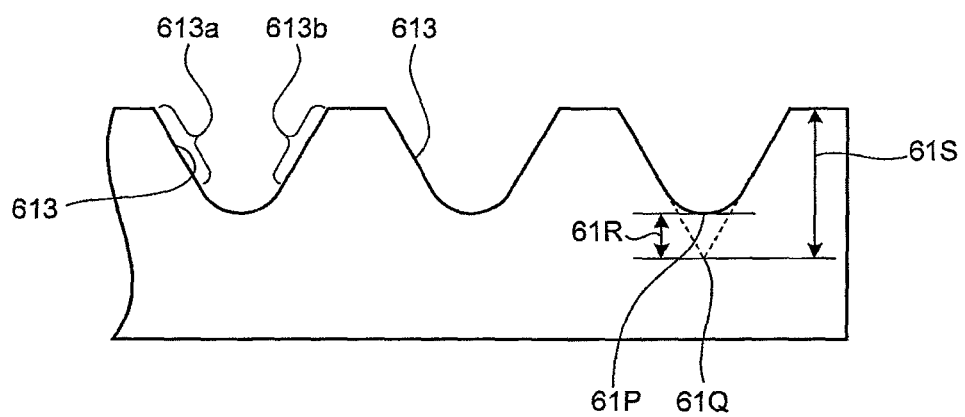
FIG. 5 is a partial cross-sectional view showing a modification of concave portions shown in FIG. 4.
Figure 6:
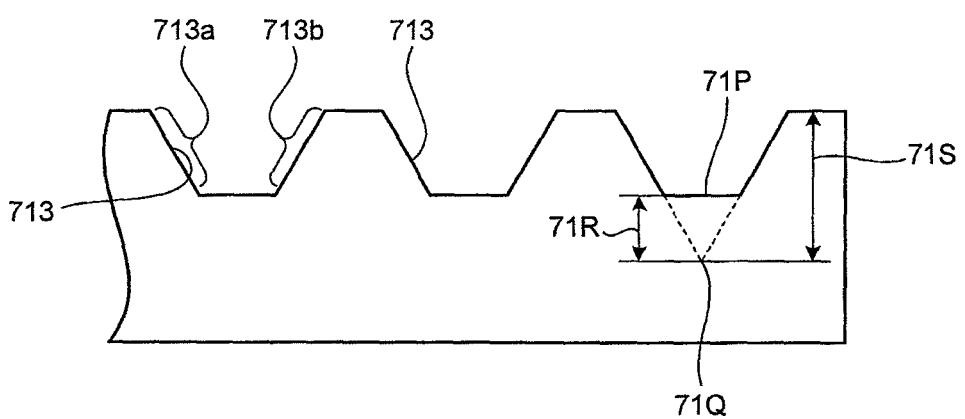
FIG. 6 is a partial cross-sectional view showing another modification of the concave portions shown in FIG. 4.

When the apex of each pyramid has a rounded shape as shown in FIG. 5, the difference 61R in height between the apex 61P and an apex 61Q, which is the non-rounded sharp apex of the pyramid, may be equal to or smaller than 20% of the height 61S of the pyramid with the non-rounded sharp apex. When the apex of each pyramid has a flat truncated shape as shown in FIG. 6, the difference 71R in height between a flat portion 71P and an apex 71Q, which is the non-flat sharp apex of the pyramid, may be equal to or smaller than 20% of the height 71S of the pyramid with the non-flat sharp apex.

No particular limitation is imposed on the depth of the concave portions in the concave-convex structure. The maximum value (Ra(max)) of the center line mean roughness measured in various directions (various directions in a plane parallel to the device light-emitting surface) on the surface having the concave-convex structure formed thereon may be in the range of 1 to 50 μm. When the concave-convex structure is formed on the concave-convex structure layer, the depth of the concave portions can be set to a preferred value relative to the thickness of the concave-convex structure layer. For example, when a hard material advantageous for maintaining the durability of the concave-convex structure layer is used as the material for the concave-convex structure layer, the smaller the thickness of the concave-convex structure layer, the higher the flexibility of the multi-layered body, and the more easily the multi-layered body can be handled in the process of manufacturing the surface light source device. More specifically, the difference between the depth 16D of the concave portion shown in FIG. 4 and the thickness 16E of the concave-convex structure layer 111 is preferably 0 to 30 μm.

In the first invention, the angle formed by the device light-emitting surface and the oblique surfaces of the concave portions is preferably 40 to 70° and more preferably 45 to 60°. For example, when the shape of the concave portions is a quadrangular pyramid as shown in FIGS. 1, 2, 3, and 4, the vertex angle (the angle 11N in FIG. 4) is preferably 60 to 90°. From the viewpoint of minimizing the change in color tone at different viewing angles and improving the light extraction efficiency, the larger the angle between the device light-emitting surface and the oblique surface, the more preferable. Specifically, the angle is preferably, for example, 55° or larger and more preferably 60° or larger. In such a case, the upper limit of the angle may be about 70°, in consideration of maintaining the durability of the concave-convex structure layer.

When the shape of the concave portions is a pyramid, conical, or groove shape with a rounded or flat truncated apex, the angles of the oblique surfaces other than the rounded or truncated portions are regarded as the angles of the aforementioned oblique surfaces. For example, in the examples shown in FIGS. 5 and 6, surfaces 613a, 613b, 713a, and 713b are regarded as the oblique surfaces. By setting the angles of the oblique surfaces in this manner, the light extraction efficiency can be improved. The angles of all oblique surfaces in the concave-convex structure are not necessarily the same, and oblique surfaces having different angles within the aforementioned range may coexist. The angle formed by the oblique surface of a conical shape and the device light-emitting surface may be the angle formed by the generating line of the cone and the device light-emitting surface.

The plurality of concave portions may be aligned on the device light-emitting surface in any appropriate form. For example, the plurality of concave portions may be aligned in two or more mutually crossing directions on the device light-emitting surface. More specifically, the plurality of concave portions may be aligned in two mutually orthogonal directions, as in the concave portions 113 shown in FIGS. 1 and 3.

When the concave portions are aligned in two or more directions, spacings may be provided between concave portions adjacent in one or more directions. By providing such spacings, flat portions are formed. For example, in the alignment of the concave portions 113 shown in FIG. 3, spacings 11J and 11K are provided in the two mutually orthogonal directions X and Y so as to form the flat portions 114. With this configuration, both favorable light extraction efficiency and high mechanical strength of the device light-emitting surface can be obtained.

(Manufacturing Method)

No particular limitation is imposed on the method of manufacturing the surface light source device of the first invention. Manufacture of the above exemplified surface light source device having the light-emitting surface structure layer including the concave-convex structure layer, the substrate film, the bonding layer, and the glass substrate may be performed as follows. The layers constituting the organic EL element may be formed on one surface of the glass substrate. Before or after the formation of these layers, the multi-layered body including the concave-convex structure layer and the substrate film may be attached to the other surface of the glass substrate via a bonding layer. The surface light source device may thereby be manufactured.

The multi-layered body including the concave-convex structure layer and the substrate film may be manufactured by preparing a mold such as a metal mold having a desired shape and transferring this shape to the layer of a material for forming the concave-convex structure layer. Specific examples of the method may include:

(Method 1) a method that includes preparing an unprocessed multi-layered body having a layer of a resin composition A that constitute the substrate film and a layer of a resin composition B for forming the concave-convex structure layer (the concave-convex structure has not been formed at this point) by, e.g., co-extrusion, and forming the concave-convex structure on the surface on the resin composition B side of the unprocessed multi-layered body; and (Method 2) a method that includes applying the resin composition B in liquid form to the substrate film, putting a mold on the layer of the applied resin composition B, and curing the resin composition B with the mold put thereon to form the concave-convex structure layer.

In Method 1, the unprocessed multi-layered body may be obtained by, for example, extrusion molding in which the resin composition A and the resin composition B are co-extruded. Then a mold having a desired surface shape may be pressed against the surface on the resin composition B side of the unprocessed multi-layered body, whereby the concave-convex structure is formed.

More specifically, an unprocessed multi-layered body in a lengthy shape is formed continuously by extrusion molding and is then pressed between a transcription roller having the desired surface shape and a nip roller. This allows continuous manufacturing in an efficient manner. Preferably, the nipping pressure between the transcription roller and the nip roller is several MPa to several tens of MPa. Preferably, the temperature during transcription is equal to or higher than Tg and equal to or lower than (Tg+100° C.) where Tg is the glass transition temperature of the resin composition B. The contacting time the unprocessed multi-layered body with the transcription roller may be controlled by adjusting the feeding speed of the film, i.e., the rotation speed of the rollers and is preferably 5 seconds or longer and 600 seconds or shorter.

In Method 2, it is preferable to use, as the resin composition B that forms the concave-convex structure layer, a composition that is curable with energy rays such as ultraviolet rays. Such a resin composition B is applied to the substrate film and cured by irradiation with energy rays such as ultraviolet rays from a light source positioned on the back side of the coated surface (the side opposite to the surface of the substrate film to which the resin composition B has been applied) with the mold put on the resin composition B. Then the mold is removed, whereby the multi-layered body in which the coating of the resin composition B serves as the concave-convex structure layer can be formed.

<Embodiment 1-2>

In the surface light source device of the first invention, the shape of the concave portions constituting the device light-emitting surface is not limited to the pyramid shape exemplified in Embodiment 1-1 described above. For example, the concave portions may have a shape that is part of a sphere as in Embodiment 1-2 which will be described below.

Figure 7:
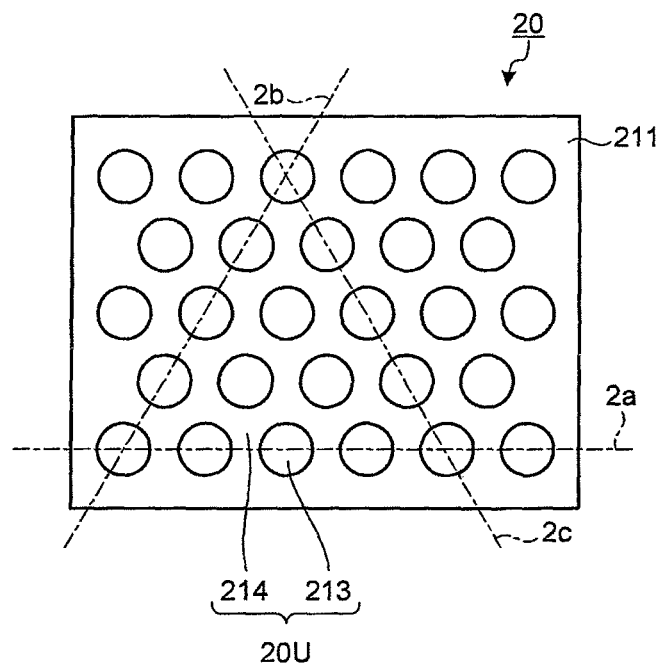
FIG. 7 is a top view schematically showing a surface light source device according to Embodiment 1-2.
Figure 8:
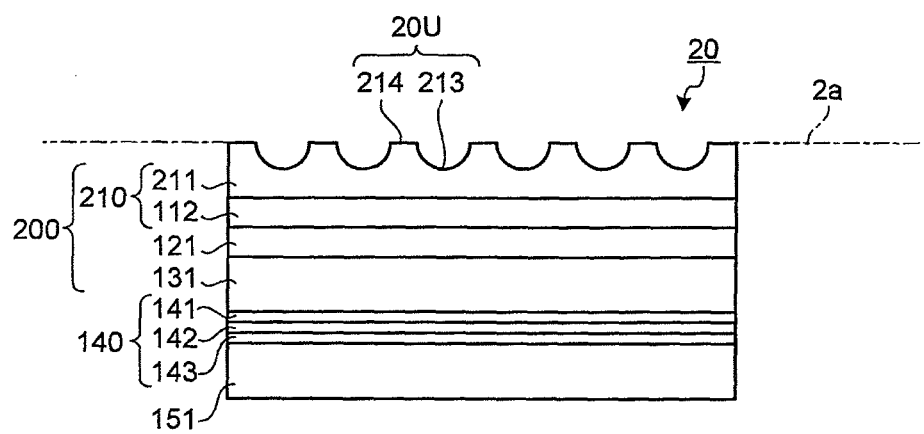
FIG. 8 is a cross-sectional view showing a cross-section obtained by cutting the surface light source device shown in FIG. 7 along a plane that passes through line 2a in FIG. 7 and is perpendicular to a device light-emitting surface.

Embodiment 1-2 is a second embodiment according to the first invention. FIG. 7 is a top view schematically showing a surface light source device according to Embodiment 1-2, and FIG. 8 is a cross-sectional view showing a cross-section obtained by cutting the surface light source device shown in FIG. 7 along a plane that passes through line 2a in FIG. 7 and is perpendicular to the device light-emitting surface. As shown in FIGS. 7 and 8, the surface light source device 20 according to Embodiment 1-2 has the same configuration as that of Embodiment 1-1 except that the shape of the device light-emitting surface, i.e. the surface shape of a concave-convex structure layer 211 in a multi-layered body 210 constituting a light-emitting surface structure layer 200, is different from that in Embodiment 1-1.

The concave portions 213 formed on the surface of the concave-convex structure layer 211 have a hemispherical shape and are aligned successively on the device light-emitting surface 20U at regular intervals in three alignment directions parallel to lines 2a, 2b, and 2c. The angles between lines 2a, 2b, and 2c are 60°. Spacings are provided between concave portions 213 adjacent in the directions of the lines 2a, 2b, and 2c, and these spacings form flat portions 214.

With the device light-emitting surface having the structure including the hemispherical concave portions and the flat portions formed as the spacings therebetween, the light extraction efficiency can also be improved, and the change in color tone at different viewing angles can also be reduced, as in the pyramid-shaped concave portions in Embodiment 1-1. In addition, the mechanical strength of the device light-emitting surface can be improved.

<Embodiment 1-3>

In the surface light source device of the first invention, the shape of the concave portions constituting the device light-emitting surface may also be a groove shape as in Embodiment 1-3 which will be described below.

Figure 9:
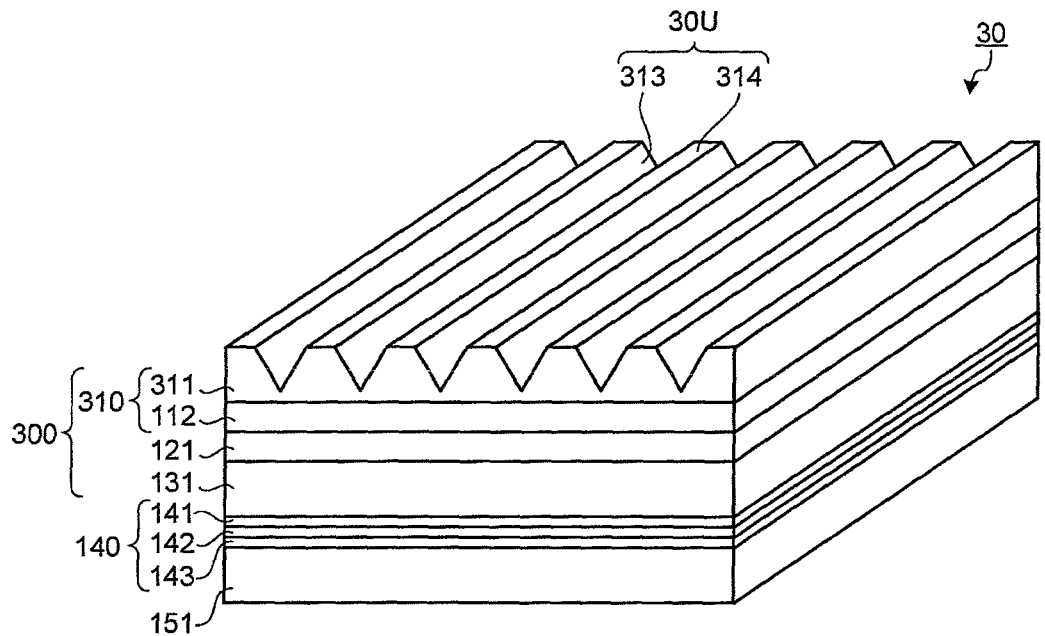
FIG. 9 is a perspective view schematically showing a surface light source device according to Embodiment 1-3.

Embodiment 1-3 is a third embodiment according to the first invention. FIG. 9 is a perspective view schematically showing the surface light source device according to Embodiment 1-3. As shown in FIG. 9, the surface light source device 30 according to Embodiment 1-3 has the same configuration as that of Embodiment 1-1 except that the shape of the device light-emitting surface, i.e. the surface shape of a concave-convex structure layer 311 in a multi-layered body 310 constituting a light-emitting surface structure layer 300, is different from that in the first embodiment.

Each of a plurality of concave portions 313 formed on the surface of the concave-convex structure layer 311 has a linear groove shape and includes two flat oblique surfaces. Therefore, a cross-section obtained by cutting a concave portion 313 along a plane perpendicular to the extending direction of the grooves has a triangular shape with two oblique sides. The plurality of concave portions 313 are aligned in parallel to each other on a device light-emitting surface 30U. At each gap between adjacent concave portions 313, Spacings 314 are provided. These spacings 314 constitute flat portions on the device light-emitting surface 30U.

With the device light-emitting surface having a structure including the groove-shaped concave portions and the flat portions formed as the spacings therebetween, the light extraction efficiency can also be improved, and a change in color tone at different viewing angles can also be reduced, as in the pyramid-shaped concave portions in the Embodiment 1-1. In addition, the mechanical strength of the device light-emitting surface can be improved.

No particular limitation is imposed on the groove shape of the concave portions so long as it includes oblique surfaces. The cross-sectional shape of the concave portions is not limited to a triangular shape exemplified above and may be any of various shapes. For example, the cross-sectional shape of the grooves may be any of other polygonal shapes such as pentagonal and heptagonal shapes and shapes other than polygonal shapes such as a part of a circle. Similar to the aforementioned Embodiment 1-1 wherein the apexes of the pyramids or cones may be a deformed to be a rounded shape or a flat truncated shape, the shape of the cross-section of each groove may be deformed to be a shape with a rounded apex or a flat truncated shape.

<Embodiment 1-4>

In the surface light source device of the first invention, when the shape of the concave portions constituting the device light-emitting surface is a pyramid shape, the pyramid shape is not limited to the simple pyramid shape exemplified in Embodiment 1-1 described above. For example, the shape of the concave portions may be a combination of a plurality of pyramid shapes as in Embodiment 1-4 which will be described below.

Figure 10:
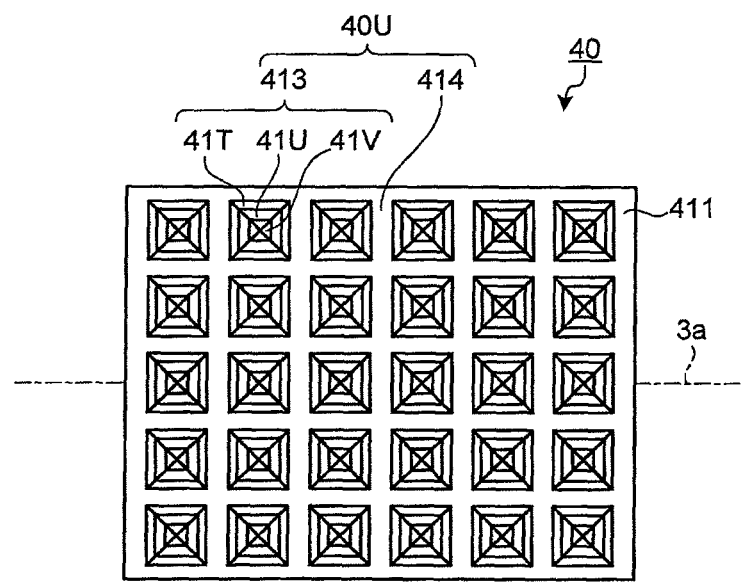
FIG. 10 is a top view schematically showing a surface light source device according to Embodiment 1-4.
Figure 11:
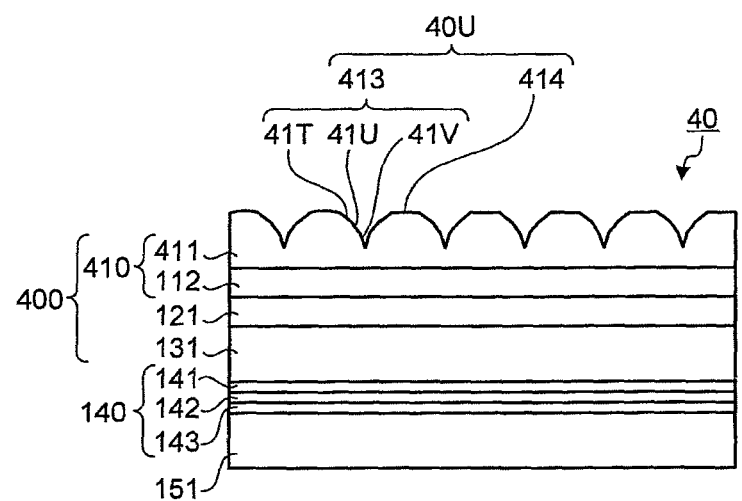
FIG. 11 is a cross-sectional view showing a cross-section obtained by cutting the surface light source device shown in FIG. 10 along a plane that passes through line 3a in FIG. 10 and is perpendicular to a device light-emitting surface.

Embodiment 1-4 is a fourth embodiment according to the first invention. FIG. 10 is a top view schematically showing a surface light source device according to Embodiment 1-4, and FIG. 11 is a cross-sectional view showing a cross-section obtained by cutting the surface light source device shown in FIG. 10 along a plane that passes through line 3a in FIG. 10 and is perpendicular to a device light-emitting surface. As shown in FIGS. 10 and 11, the surface light source device 40 according to Embodiment 1-4 has the same configuration as that of Embodiment 1-1 except that the shape of the device light-emitting surface 40U, i.e. the shape of concave portions 413 in a concave-convex structure layer 411 in a multi-layered body 410 constituting a light-emitting surface structure layer 400, is different from the shape of the concave portions 113 in Embodiment 1-1.

Each of the plurality of concave portions 413 formed on the surface of the concave-convex structure layer 411 has three types of oblique surfaces 41T, 41U, and 41V having different inclination angles with respect to the device light-emitting surface. The oblique surface 41V has the steepest inclination, and four oblique surfaces 41V form a quadrangular pyramid. The inclination of the oblique surfaces 41U is less steep than that of the oblique surfaces 41V, and the inclination of the oblique surfaces 41T is less steep than that of the oblique surfaces 41U. Four oblique surfaces 41U form a part of a quadrangular pyramid, and four oblique surfaces 41T also constitute a part of a quadrangular pyramid. The combination of these oblique surfaces constitutes the shape of each concave portion 413 in which three types of quadrangular pyramids or parts thereof are combined. Flat portions 414 located around the concave portions 413 are formed of spacings provided between concave portions aligned in two mutually orthogonal directions, as in the flat portions 114 in Embodiment 1-1.

With these concave portions having a shape formed of a combination of a plurality of pyramids, the change in color tone at different viewing angles may be further reduced as compared to that with the pyramid shaped concave portions in Embodiment 1-1. In addition, as in Embodiment 1-1, the light extraction efficiency can be improved, and the mechanical strength of the device light-emitting surface can be improved.

<Embodiment 1-5>

In Embodiments 1-1 to 1-4 described above, the diffusing member is a member that is provided as a layer that constitutes all or part of the light-emitting surface structure layer so as to allow the incident light to pass therethrough in a diffused manner. However, the diffusing member in the surface light source device of the first invention is not limited thereto. As exemplified in Embodiment 1-5 below, the diffusing member may also be a member that is disposed at a position farther from the light-emitting surface structure layer than the organic EL element and reflects the incident light in a diffused manner.

Figure 12:
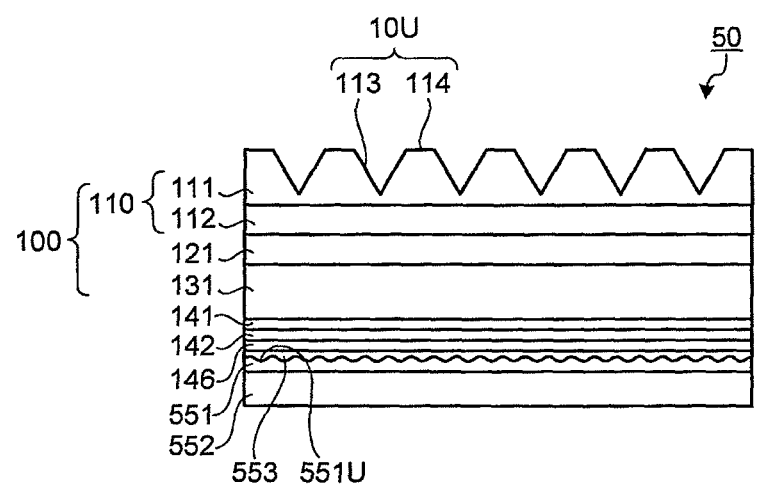
FIG. 12 is a cross-sectional view showing a cross-section obtained by cutting a surface light source device according to Embodiment 1-5 along a plane perpendicular to a device light-emitting surface.

Embodiment 1-5 is a fifth embodiment according to the first invention. FIG. 12 is a cross-sectional view showing a cross-section obtained by cutting a surface light source device according to Embodiment 1-5 along a plane perpendicular to a device light-emitting surface. As shown in FIG. 12, Embodiment 1-5 is different from Embodiment 1-1 in that the surface light source device 50 includes, as the second electrode layer, an electrode layer 146 serving as a second transparent electrode in place of the reflecting electrode 143 and includes a reflecting member 551 and a reflecting member substrate 552 in place of the sealing substrate 151. The rest of the configuration is the same as that in Embodiment 1-1.

In the surface light source device 50, the reflecting member 551 has a property to reflect on a reflecting surface 551U the light incident on the reflecting member 551, and the reflecting surface 551U is not flat but has a concave-convex shape. Therefore, the reflecting member 551 can reflect the incident light in a diffused manner.

The reflection on the reflecting surface 551U of the reflecting member 551 in a diffused manner means that at least part of the incident light is reflected in a non-specularly manner (reflected in a direction different from that of specular reflection). By this reflection, at least a part of the light from the luminescent layer 142 is diffused before the light reaches the device light-emitting surface 10U.

In the surface light source device 10 in Embodiment 1-1, a layer constituting all or part of the light-emitting surface structure layer serves as the diffusing member. However, in the surface light source device 50 in Embodiment 1-5, the reflection of light by the reflecting member 551 in a diffused manner brings about the same effects as those by the diffusing member in the light-emitting surface structure layer. Therefore, the effects of the first invention can be obtained without providing the diffusing member in the light-emitting surface structure layer. However, if desired, a diffusing member similar to that used in Embodiment 1-1 may be provided in the light-emitting surface structure layer as an additional diffusing member in addition to the reflecting member 551.

A gap 553 between the second transparent electrode 146 and the reflecting surface 551U of the reflecting member 551 may be filled with any optional material such as a filler or an adhesive agent that does not significantly impair the transmission of light. The gap may be a gap in which air or any other gas is present, or the gap may be a vacuum gap, so long as a problem such as significant deterioration of the durability of the luminescent layer 142 does not occur.

No particular limitation is imposed on the material for the reflecting member 551. The reflecting member 551 may be a member including at least a layer of material having a property of reflecting incident light, such as aluminum and silver. More specifically, a reflecting member having a fine concave-convex structure may be obtained by forming one or a plurality of layers of such a metal on a substrate having a fine concave-convex structure. A reflecting member having a fine concave-convex structure may also be obtained by forming a layer of such a metal on a flat substrate and then processing the metal layer. A reflecting member having a fine concave-convex structure may also be obtained by forming a layer of such a metal on a flat resin substrate and then causing corrugation of the resin substrate. For the purpose of improving adhesion properties, corrosion resistance, and abrasion resistance, the reflecting member may have a structure in which a functional layer such as an inorganic thin film or an organic thin film is deposited on the surface of the metal layer.

The material of the reflecting member 551 is not limited to a metal. For example, it is possible to use a diffusing plate formed of any arbitrary material and having a white surface by which the incident light is reflected in a diffused manner.

<Embodiment 1-6>

In Embodiment 1-1 and other Embodiments described above, the quadrangular pyramids are aligned in two directions on the device light-emitting surface, wherein the flat portions are formed by providing spacings between quadrangular pyramids adjacent in both two directions. However, the first invention is not limited thereto. For example, spacings may be provided only in one of the two directions, as in Embodiment 1-6 which will be described below.

Figure 13:
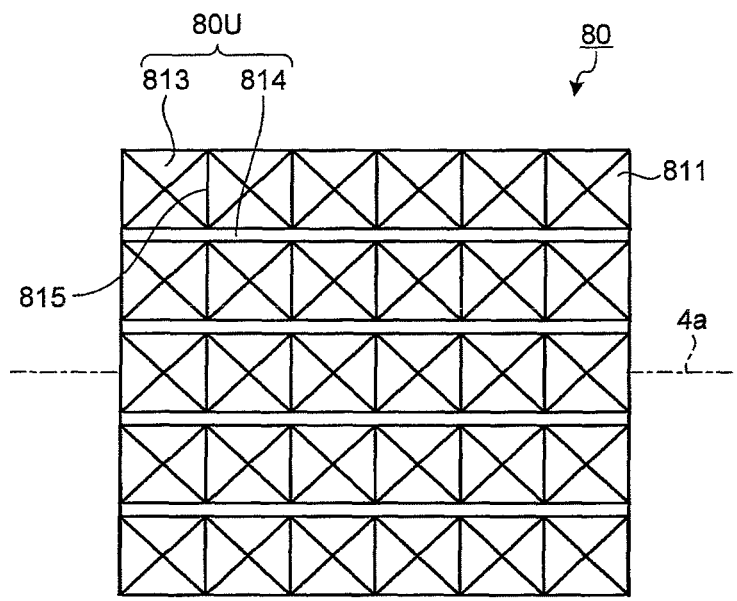
FIG. 13 is a top view schematically showing a surface light source device according to Embodiment 1-6.
Figure 14:
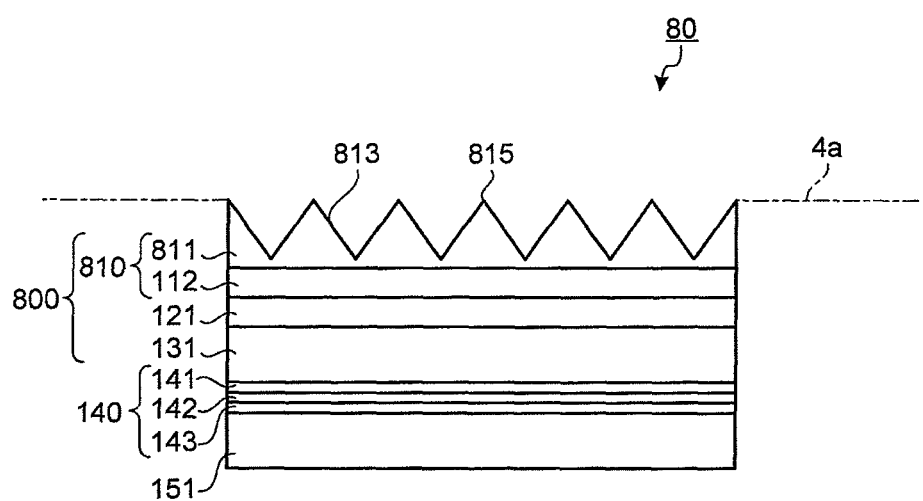
FIG. 14 is a cross-sectional view showing a cross-section obtained by cutting the surface light source device shown in FIG. 13 along a plane that passes through line 4a in FIG. 13 and is perpendicular to a device light-emitting surface.

Embodiment 1-6 is a sixth embodiment according to the first invention. FIG. 13 is a top view schematically showing a surface light source device according to Embodiment 1-6, and FIG. 14 is a cross-sectional view showing a cross-section obtained by cutting the surface light source device shown in FIG. 13 along a plane that passes through line 4a in FIG. 13 and is perpendicular to the device light-emitting surface. As shown in FIGS. 13 and 14, the surface light source device 80 according to Embodiment 1-6 has the same configuration as that of Embodiment 1-1 except that the shape of the device light-emitting surface 80U, i.e. the surface shape of a concave-convex structure layer 811 in a multi-layered body 810 constituting the light-emitting surface structure layer 800, is different from that of Embodiment 1-1.

The shape of each of concave portions 813 formed on the surface of the concave-convex structure layer 811 is the same as that of the concave portions 113 in Embodiment 1-1. However, spacings between concave portions 813 are provided only between concave portions 813 adjacent in a direction orthogonal to line 4a in FIG. 13. Therefore, flat portions 814 extending in a direction parallel to line 4a are formed. In such an instance, the abrasion resistance when the device light-emitting surface undergoes abrasion in a certain direction, for example, in a direction parallel to the extending direction of the flat portions 814, may be lowered more than that in Embodiment 1-1. However, the light extraction efficiency may be improved. Therefore, this configuration may be preferred in some cases.

As to the shape of the concave portions 813 in the present embodiment, the height of boundary portions 815 between adjacent concave portions 813 is the same as the height of the flat portions 814. However, the height of the boundary portions 815 may be different from the height of the flat portions 814.

Figure 15:
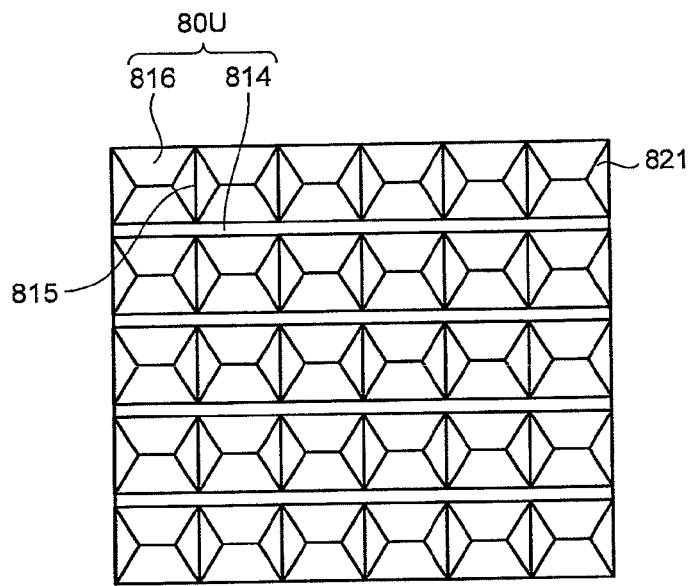
FIG. 15 is a top view schematically showing a concave-convex structure layer according to a modification of Embodiment 1-6.

In the example described above, the concave portions 813 have only a quadrangular pyramid shape. However, the concave portions 813 may have a shape other than the quadrangular pyramid shape. For example, as shown in FIG. 15, a plurality of concave portions 816 having a hip-roof shape may be aligned. A concave-convex structure layer 821 shown in FIG. 15 is a modification of the concave-convex structure layer 811 according to Embodiment 1-6 and has the same structure as that of the concave-convex structure layer 811 according to Embodiment 1-6 except that the shape of the concave portions is different.

<Embodiment 1-7>

In Embodiments 1-1 to 1-6, the flat portions on the concave-convex structure layer do not have a variety in height (the height when the device is placed with the device light-emitting surface facing upward and being parallel to the horizontal direction) but have a uniform height. However, the first invention is not limited thereto. For example, as in Embodiment 1-7 which will be described below, the flat portions may have a variety in height.

Figure 16:
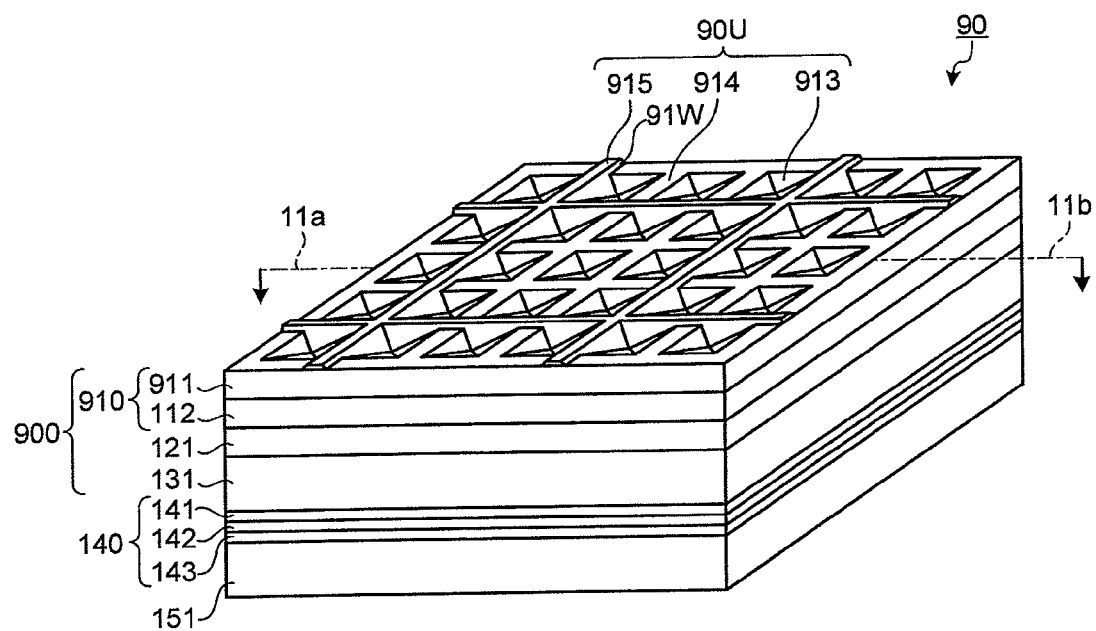
FIG. 16 is a top view schematically showing a surface light source device according to Embodiment 1-7.
Figure 17:
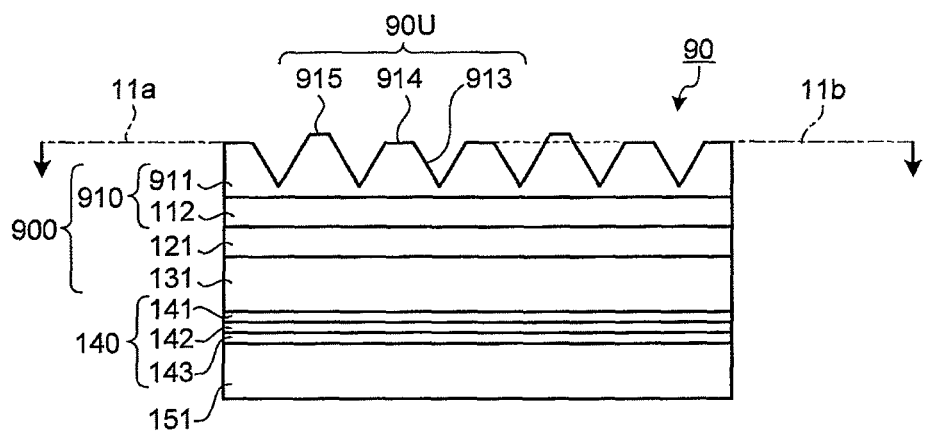
FIG. 17 is a cross-sectional view showing a cross-section obtained by cutting the surface light source device shown in FIG. 16 along a plane that passes through line 11a-11b in FIG. 16 and is perpendicular to a device light-emitting surface.

Embodiment 1-7 is a seventh embodiment according to the first invention. FIG. 16 is a top view schematically showing a surface light source device according to Embodiment 1-7, and FIG. 17 is a cross-sectional view showing a cross-section obtained by cutting the surface light source device shown in FIG. 16 along a plane that passes through line 11a-11b in FIG. 16 and is perpendicular to a device light-emitting surface. As shown in FIGS. 16 and 17, the surface light source device 90 according to Embodiment 1-7 has the same configuration as that of Embodiment 1-1 except that the shape of the device light-emitting surface 90U, i.e. the surface shape of a concave-convex structure layer 911 in a multi-layered body 910 constituting a light-emitting surface structure layer 900, is different from that in Embodiment 1-1.

Each of concave portions 913 formed on the surface of the concave-convex structure layer 911 has approximately the same shape as the shape of the concave portions 113 in Embodiment 1-1. However, between the concave portions 913, two types of flat portions including lower flat portions 914 and higher flat portions 915 are provided, and the flat portions 914 and 915 are connected by oblique surfaces 91W.

In the present embodiment, two rows of flat portions 914 and one row of flat portions 915 are disposed in an alternate manner, whereby a repeating unit composed of two flat portions 914, one flat portion 915, and the oblique surfaces (including the oblique surfaces 91W) of three concave portions 113 between these flat portions is repeated on the cross-section of the light-emitting surface structure layer 900. Such repetitions may also appear on a cross-section perpendicular to the lines 11a and 11b shown in FIG. 16 and to the device light-emitting surface, as well as on the cross-section passing through the lines 11a and 11b.

When the flat portions have such a variety in height, the abrasion resistance of the device light-emitting surface is slightly reduced. However, such variety also brings about a preferable effect of reducing a rainbow unevenness which appears upon observing the device light-emitting surface. More specifically, when a surface light source device is produced with its device light-emitting surface being designed such that the flat portions do not have a variety in height, the heights of the flat portions may contain errors due to the errors caused during formation of the flat portions. Such errors may cause interference of the light from the device light-emitting surface (i.e., one or both of the light emitted from the device and external light reflected by the device light-emitting surface), and this may cause a rainbow unevenness. When the difference in height between the two types of flat portions 914 and 915 is intentionally set to a size difference larger than the difference that causes interference of light, the interference can be prevented, and the rainbow unevenness can be suppressed. The size difference larger than the difference that causes interference of light is, for example, equal to or larger than 0.62 times and preferably equal to or larger than 1.5 times the center wavelength of the light emitted from the surface light source device.

In the present embodiment, the flat portions have a predetermined variety in height (a size difference larger than the difference that causes interference). However, there may be another possible structure wherein, for example, the height positions of the flat portions is the same, but the concave portions have a predetermined difference in depth (a size difference larger than the difference that causes interference). Also in this case, the same effects as that of the previously mentioned embodiment can be obtained. Alternatively, the variety may be present as to both the heights of the flat portions and the depths of the concave portions. The aforementioned configuration in which the flat portions or the concave portions have a predetermined variety is applicable not only to the present embodiment but also to all embodiments in the scope of the present invention.

The aforementioned numerical range has been verified by the following findings. In an instance of a concave-convex structure layer designed such that all the flat portions have the same height, when the height of the flat portions includes an error of 170 nm or larger, interference occurs and the rainbow unevenness is observed. In such an instance, it has been found out that the occurrence of the rainbow unevenness can be suppressed by intentionally providing a size difference in height equal to or larger than 2 times the minimum error that causes the rainbow unevenness. In another instance of a concave-convex structure layer designed such that all the flat portions have the same height, when the height of the flat portions fluctuates with a standard deviation of σ1 nm(≅60 nm), interference occurs and the rainbow unevenness is observed. In such an instance, it has been found out that the occurrence of the rainbow unevenness can be suppressed by intentionally providing a size difference in height equal to or larger than 6×σ1 nm (=360 nm). The aforementioned two findings show that the size difference larger than the difference that causes interference of light is equal to or larger than 0.62 times the center wavelength of the light emitted from the surface light source device.

<Embodiment 1-8>

In the surface light source device of the first invention, the device light-emitting surface may not be provided only on one side of the surface light source device. For example, as in Embodiment 1-8 which will be described below, both surfaces of the surface light source device may be device light-emitting surfaces.

Figure 18:
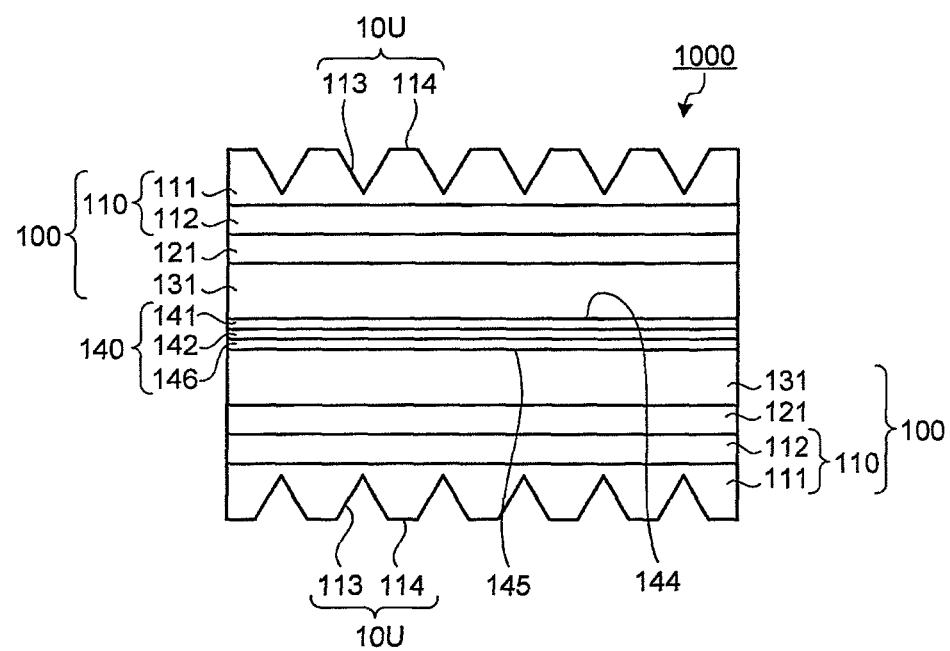
FIG. 18 is a cross-sectional view schematically showing a cross-section obtained by cutting a surface light source device according to Embodiment 1-8 along a plane perpendicular to a device light-emitting surface.

Embodiment 1-8 is an eighth embodiment according to the first invention. FIG. 18 is a cross-sectional view schematically showing a cross-section obtained by cutting a surface light source device according to Embodiment 1-8 along a plane perpendicular to a device light-emitting surface. As shown in FIG. 18, Embodiment 1-8 is different from Embodiment 1-1 in that the surface light source device 1000 includes an electrode layer 146 serving as a second transparent electrode in place of the reflecting electrode 143 and further includes another light-emitting surface structure layer 100 in place of the sealing substrate 151. The rest of the configuration is the same as that in Embodiment 1-1. Any optional material such as a filler or an adhesive agent or a gap may be present between the second transparent electrode 146 and the light-emitting surface structure layer 100 on the lower side in the figure. In the gap, air or any other gas may be present so long as a problem such as significant deterioration of the durability of the luminescent layer 142 does not occur. Alternatively, the gap may be a vacuum gap.

Since the second electrode layer 146 is a transparent electrode, the light from the luminescent layer 142 passes through the first electrode layer 141 and the second electrode layer 146 and is then emitted from both the device light-emitting surfaces 10U on the upper and lower sides in the figure. When light is emitted from both the front and back sides as described above, the light extraction efficiency can also be improved, and the change in color tone at different viewing angles can also be reduced, in a similar manner as in Embodiment 1-1. In addition, the mechanical strength of the device light-emitting surface can also be improved.

In the surface light source device 1000 of the present embodiment, generally, the light that enters one of the device light-emitting surfaces 10U passes through the surface light source device 1000 and is emitted from the other device light-emitting surface 10U. Therefore, the opposite side can be viewed with naked eyes through the surface light source device 1000, and the surface light source device can be of a see-through type. This allows diversification of the design.

In the example shown in the present embodiment, the light-emitting surface structure layers 100 having the same structure are disposed on both the upper and lower sides in the figure of the surface light source device 1000. However, a combination of different light-emitting surface structure layers may be provided. For example, the light-emitting surface structure layer 100 may be provided on the surface of the first electrode layer 141, and the light-emitting surface structure layer 200 may be provided on the surface of the second electrode layer 146.

<Lighting Device and Backlight Device>

Each of the lighting device of the first invention and the backlight device of the first invention includes the surface light source device of the first invention.

The lighting device of the first invention includes the surface light source device of the first invention as a light source and may further include any optional components such as a member for holding the light source and a circuit for supplying electric power. The backlight device of the first invention includes the surface light source device of the first invention as a light source and may further include any optional components such as a casing, a circuit for supplying electric power, a diffusion plate for making the emitted light more uniform, a diffusing sheet, and a prism sheet. The applications of the backlight device of the first invention include display devices, such as liquid crystal display devices, for displaying images by controlling pixels and backlights for display devices, such as signboards, for displaying still images.

The first invention is not limited to the examples shown in the aforementioned embodiments, and modifications may be made within the scope of the claims of the present application and the scope of equivalents thereto.

For example, in the description of the examples of the aforementioned embodiments, the light-emitting surface structure layers that are composed of a concave-convex structure layer, a substrate film layer, a bonding layer, and a glass substrate have been exemplified. However, the light-emitting surface structure layer may be composed of a smaller number of layers, or alternatively may further include, in addition to these layers, an optional layer. For example, a coating layer may be provided on the concave-convex structure layer and may define the concave-convex structure of the device light-emitting surface.

In the examples shown in the aforementioned embodiments, all the concave portions distributed over the entire device light-emitting surface have the same shape. However, concave portions having different shapes may also coexist on the device light-emitting surface. For example, pyramid-shaped concave portions having different sizes may coexist. Pyramid-shaped concave portions and conical concave portions may also coexist. Concave portions having a shape of a combination of a plurality of pyramids and concave portions having a simple pyramid shape may also be coexist.

In the examples shown in the aforementioned embodiments, the widths of the flat portions and the spacings between adjacent flat portions are always constant. However, flat portions having a small width and flat portions having a large width may coexist. Narrow spacings between the flat portions and wide spacings between the flat portions may also coexist. When the flat portions have a size difference in at least one of their height, width, and spacing that is larger than the difference that causes interference of emitted light or reflected light in this manner, the rainbow unevenness caused by interference can be suppressed.

In the examples shown in the aforementioned embodiments which include a reflecting electrode layer, the reflecting electrode layer may be replaced with a combination of a transparent electrode and a reflecting layer. Also in such a case, a device having the same effect as that with the reflecting electrode can be configured.

[II. Description of Second Invention]

The second invention will be described in detail by way of embodiments and exemplifications, but the second invention is not limited to the following embodiments and exemplifications.

<Embodiment 2-1>

A surface light source device according to a first embodiment of the second invention will be described hereinbelow.

Figure 19:
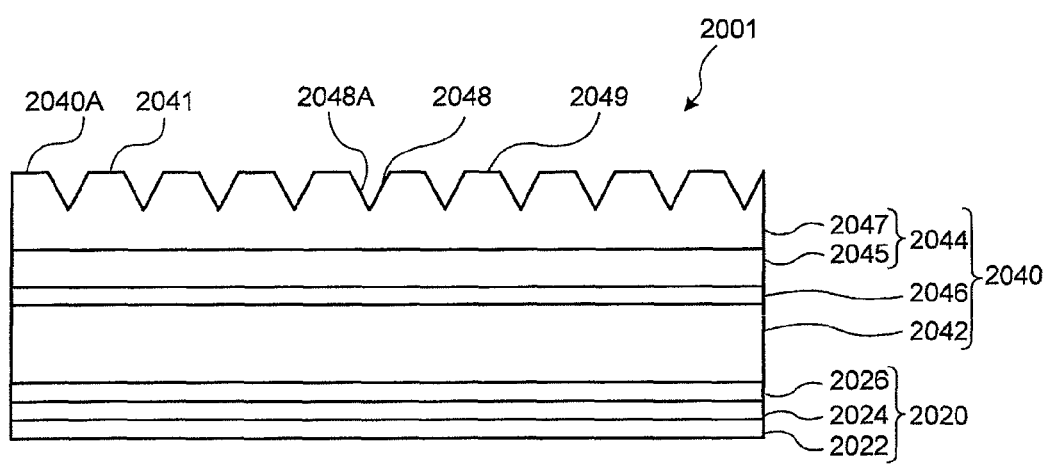
FIG. 19 is a vertical cross-sectional view illustrating a surface light source device according to Embodiment 2-1.

Embodiment 2-1 is a first embodiment according to the second invention. FIG. 19 is a vertical cross-sectional view illustrating the surface light source device according to Embodiment 2-1. As shown in FIG. 19, the surface light source device 2001 according to the present embodiment has a light-emitting surface 2040A having a rectangular shape in a plan view and includes an organic EL element 2020 and a concave-convex structure body 2040 serving as a light-emitting-side member that is disposed directly or indirectly on at least one surface of the organic EL element 2020.

The organic EL element 2020 includes, in the following order, a first electrode layer 2022 constituting a reflecting electrode, a luminescent layer 2024, and a second electrode layer 2026 serving as a transparent electrode. When a voltage is applied between the first electrode layer 2022 and the second electrode layer 2026, the luminescent layer 2024 emits light, so that the organic EL element 2020 can be used as a light source. Such an organic EL element 2020 can be preferably used for a lighting device and a display device.

As the luminescent layer 2024, any known luminescent layer may be used. The number of types of luminescent materials used in the luminescent layer 2024 is not limited to one, and the number of luminescent layers is not limited to one. In order to adapt to the use as a light source, the luminescent layer may be a single type of layer or a combination of a plurality of types of layers. In this manner, white light or light of a color close to white can be emitted.

No particular limitation is imposed on the electrodes of the organic EL element 2020, and any of known electrodes may be appropriately selected. The first electrode layer 2022 is a metal electrode layer. The second electrode layer 2026 is a transparent electrode layer. With this configuration, the light emitted from the luminescent layer 2024 passes through the second electrode layer 2026, or is reflected on the first electrode layer 2022 and then passes through the luminescent layer 2024 and the second electrode layer 2026, whereby the light can be emitted to the outside of the organic EL element 2020. The first electrode layer 2022 may also be formed as a transparent electrode layer. In such a case, light may be emitted from both surfaces of the organic EL element. When the first electrode layer 2022 is a transparent electrode layer, a reflecting member or a scattering member (such as a white scattering member disposed via an air layer) may be disposed on the side opposite to the luminescent layer 2024.

If necessary, the organic EL element 2020 may further include, between the first electrode layer 2022 and the second electrode layer 2026, other layers such as a hole injection layer, a hole transport layer, an electron transport layer, an electron injection layer, and a gas barrier layer, in addition to the luminescent layer 2024. The organic EL element 2020 may further include an optional component such as wiring leads for supplying electric current to the electrode layers 2022 and 2026, and a peripheral structure for sealing the luminescent layer.

No particular limitation is imposed on the materials that constitute the electrode layers and other layers disposed therebetween. Specific examples of such materials may include the materials exemplified in the description of the first invention.

The aforementioned luminescent layer and other luminescent layers may be suitably combined to obtain a stacked or tandem type luminescent layer that generates light with complementary colors. The combination of complementary colors may be yellow/blue, green/blue/red, etc.

The concave-convex structure body 2040 is disposed on the surface of the second electrode layer 2026. The surface of the concave-convex structure body 2040 that is on the side opposite to the second electrode layer 2026 is the light-emitting surface 2040A from which light emits to the outside. On the light-emitting surface 2040A, a concave-convex structure 2041 is formed. The light-emitting surface 2040A is a surface parallel to the surface of the luminescent layer 2024 of the organic EL element 2020 and is also parallel to the principal surface of the surface light source device. However, in a microscopic sense, the concave-convex structure 2041 is formed on the light-emitting surface 2040A as described above, and therefore the light-emitting surface 2040A may be non-parallel to the surface of the luminescent layer. However, unless otherwise specifically mentioned, the phrase "parallel (or perpendicular) to the light-emitting surface" simply means that an object is parallel (or perpendicular) to the light-emitting surface with the concave-convex structure etc. being neglected. Unless otherwise mentioned, a description will be given of the surface light source device placed with its light-emitting surface being parallel to the horizontal direction and facing upward. In the second invention, when components are "parallel" or "perpendicular" to each other, a deviation in the range in which the effects of the second invention are not impaired may be present. For example, a tolerance of ±5° with respect to the parallel or perpendicular angle may be allowable.

The concave-convex structure body 2040 includes a substrate 2042 made of, for example, glass and disposed on the surface of the second electrode layer 2026, a concave-convex structure main body 2044, and a bonding layer 2046 that bonds the substrate 2042 to the concave-convex structure main body 2044. The concave-convex structure main body 2044 includes a base substrate 2045 and a concave-convex structure layer 2047 disposed on the surface of the base substrate 2045 and serving as a light-distribution conversion unit. In the surface light source device 2001, at least one of the substrate 2042, the base substrate 2045, the bonding layer 2046, and the concave-convex structure layer 2047 is formed of a composition containing, for example, particles that impart light diffusibility. The layer having the light diffusibility diffuses the light from the luminescent layer 2024 and allows the resultant light to pass through the layer or to be reflected therein. Therefore, this layer functions as a disusing section in the second invention.

The substrate 2042 functions as a plate member that imparts stiffness for suppressing the warpage to the surface light source device 2001. The substrate 2042 has a good ability to seal the organic EL element 2020 and to facilitate successive formation of the layers constituting the organic EL element 2020 on the substrate 2042 in the production process. Therefore, the substrate 2042 has advantages in improving the durability of the surface light source device 2001 and for facilitating the production process. No particular limitation is imposed on the thickness of the substrate 2042. Preferably, the thickness is 0.1 to 5 mm. In the present embodiment, the substrate 2042 is made of glass. However, the substrate may be made of resin. In such a case, the refractive index of the resin or glass constituting the substrate 2042 may be 1.4 to 2.

The base substrate 2045 may be formed of a composition containing a transparent resin. The term "transparent" in the transparent resin means that it has a light transmittance suitable for use as an optical member. In the second invention, each of the layers constituting the light-emitting-side member may have a light transmittance suitable for use as an optical member, and the total light transmittance of the light-emitting-side member as a whole may be 80% or larger.

Examples of the transparent resin are the same as those described in the description of the light-emitting surface structure layer of the first invention.

The concave-convex structure layer 2047 is located at the outermost portion on the light-emitting surface side of the surface light source device 2001, and the surface of the concave-convex structure layer 2047 that is opposite to the base substrate 2045 is the light-emitting surface 2040A. The concave-convex structure layer 2047 has a concave-convex structure including a plurality of concave portions 2048 having oblique surfaces and flat portions 2049 disposed around the concave portions 2048 and formed into a flat shape so that adjacent concave portions 2048 are spaced apart. The same material as that for the base substrate 2045 described above may be used as the material constituting the concave-convex structure layer 2047. The concave-convex structure defines the light-emitting surface. When the structure including a plurality of concave portions and flat portions disposed around the concave portions is provided as described above, light extraction efficiency can be improved. In addition, the concave-convex structure is prevented from, for example, being broken off by an external impact, and therefore the mechanical strength of the light-emitting surface can be improved. The "oblique surface" is a surface forming a non-parallel angle with respect to the light-emitting surface. The surfaces of the flat portions may be parallel to the light-emitting surface.

The light extraction efficiency of the surface light source device 2001 can be improved by appropriately adjusting the ratio of the area occupied by the flat portions 2049 relative to the sum of the area occupied by the flat portions 2049 and the area occupied by the concave portions 2048 when the concave-convex structure layer 2047 is observed in a direction perpendicular to the light-emitting surface 2040A (hereinafter this ratio is referred to as a "flat portion ratio"). More specifically, when the flat portion ratio is adjusted to 10 to 75%, favorable light extraction efficiency can be obtained, and the mechanical strength of the light-emitting surface 2040A can be improved.

Each of the plurality of concave portions 2048 is a recess having a regular quadrangular pyramid shape. Therefore, oblique surfaces 2048A constituting each concave portion 2048 are identical isosceles triangles. The plurality of concave portions 2048 are aligned at regular intervals in two mutually orthogonal alignment directions and are oriented in the same direction. The angles formed by the flat portions 2049 and the oblique surfaces 2048A constituting each concave portion 2048 may be set to, for example, 60°. Therefore, the vertex angle of the regular quadrangular pyramid forming the concave portion 2048 is 60°. However, the angles formed by the oblique surfaces of the concave portions and the flat portions are preferably 40 to 70° on average in terms of further improving the light extraction efficiency while minimizing the change in color tone at different viewing angles.

As the material constituting the concave-convex structure layer 2047, a material having high hardness after curing is preferred because such a material can easily form the concave-convex structure of the light-emitting surface and can easily provide abrasion resistance of the concave-convex structure. More specifically, it is preferable to use a material having a pencil hardness of HB or higher when a resin layer having a thickness of 7 μm is formed on a base substrate with no concave-convex structure provided thereon. A material having a pencil hardness of H or higher is more preferred, and a material having a pencil hardness of 2H or higher is still more preferred. As the material for the base substrate 2045, it is preferable to use a material having some degree of flexibility, because thereby handling of the concave-convex structure main body 2044 can be facilitated during the formation of the concave-convex structure layer 2047 and/or the completed concave-convex structure main body 2044. Use of a combination of the aforementioned materials results in production of a concave-convex structure main body 2044 that can be handled easily and that has high durability, whereby a high-performance surface light source device can be easily manufactured.

Such a combination of materials may be obtained by appropriately selecting, as the resins contained in the materials, the transparent resins exemplified above. More specifically, a ultraviolet curable resin such as acrylate may be used as the transparent resin constituting the material for the concave-convex structure layer 2047, and a film made of an alicyclic olefin polymer (such as ZEONOR Film which will be described later) or a polyester film may be used as the transparent resin constituting the material for the base substrate 2045. A preferred combination of materials may thereby be obtained.

In the present embodiment, the difference in refractive index between the base substrate 2045 and the concave-convex structure layer 2047 may be as small as possible. In such a case, the difference in refractive index is preferably equal to or smaller than 0.15 and more preferably equal to or smaller than 0.05.

When any of the layers that constitute the base substrate 2045, the concave-convex structure layer 2047, etc. serve as a diffusing section, the composition used as the material for such a layer may contain particles, described later, that impart light diffusibility. For example, when one or both of the base substrate 2045 and the concave-convex structure layer 2047 are formed of a composition containing particles that provide light diffusibility, the base substrate 2045 and the concave-convex structure layer 2047 serve also as the diffusing section. In necessary, such a composition may further contain any optional component. Examples of such an optional component may include the same components as those described in the description of the light-emitting surface structure layer of the first invention.

In the present embodiment, no particular limitation is imposed on the thickness of the concave-convex structure layer 2047, but the thickness thereof is preferably 1 to 70 μm. The thickness of the concave-convex structure layer 2047 is the distance between its surface on the substrate side on which the concave-convex structure 2041 is not formed and the flat portions 2049 of the concave-convex structure body 2040. The thickness of the base substrate 2045 is preferably 20 to 300 μm.

As the material for the bonding layer 2046, any adhesive agent (encompassing a tacky agent) having a refractive index close to that of the base substrate 2045 or the concave-convex structure layer 2047 and having a transparency may be used. Specific examples of the adhesive agent may include acrylic-based adhesive agents (or acrylic-based tacky agents). The thickness of the bonding layer 2046 is preferably 5 to 100 μm.

In the surface light source device 2001 in the present embodiment, all or part of the layers constituting the concave-convex structure body 2040 may be layers that diffuse light and therefore can serve as the diffusing section. Examples of the material for the layer that diffuses light may include materials containing particles and alloy resin materials having light diffusibility that are prepared by mixing two or more types of resin. In terms of facilitating control of light diffusibility, a material containing particles is preferred, and a resin composition containing particles is particularly preferred.

The particles are the same as the particles described in the description of the diffusing member of the first invention. Therefore, the material, ratio of the amount added, diameter, refractive index, etc. of the particles are the same as those of the particles described in the description of the diffusing member of the first invention.

As described above, all or part of the layers constituting the concave-convex structure body may serve as the diffusing section. In such a case, no particular limitation is imposed on the selection of which of the layers constituting the concave-convex structure body is used as the diffusing section. The selection may be made from various points of view. For example, from the viewpoint of facilitating adjustment of the degree of diffusion, it is preferable that a layer containing a transparent resin serves as the diffusing section. From the viewpoint of ensuring sufficient light diffusibility without using an excessively large amount of particles in such a layer, it is preferable that a layer having a thickness of more than a certain degree, for example, 5 μm or larger, serves as the diffusing section.

Preferably, the concave-convex structure layer is formed of a material having high hardness, as described above. However, when the thickness of the high-hardness material layer used in the surface light source device is large, undesirable warpage of the light-emitting surface may occur with the lapse of time. Therefore, from this point of view, it is preferable that a layer (for example, a base substrate and/or a bonding layer) that is different from the concave-convex structure layer and has properties that facilitate plastic deformation is provided in addition to the concave-convex structure layer, and this layer serves as the diffusing section.

When a layer that is produced by a process that does not include a step of heating the material thereof (for example, a transparent resin) is used as the diffusing section, the production process can be easily managed. For example, a problem such as clogging of a resin conveying passage with particles can be easily addressed. From this point of view, it is preferable to use the bonding layer as the diffusing section. It is also preferable to use the bonding layer and a layer other than the bonding layer as the diffusing section. For example, when the bonding layer and the base substrate are used as the diffusing section and the ratio of the particles added to the base substrate is reduced, the process of producing the base substrate can be easily managed (for example, the frequency of occurrence of clogging can be reduced). No particular limitation is imposed on the refractive index of the diffusing section. The refractive index is preferably 1.45 to 2, more preferably 1.6 to 2, and still more preferably 1.7 to 2. It is preferable that the refractive index of any layer on the light-emitting side of the diffusing section is smaller than the refractive index of the diffusing section. When the diffusing section has a large refractive index as described above, the range of selection of the refractive index of any layer on the light-emitting side of the diffusing section is widened, and therefore the material for such a layer may be more freely selected.

An additional layer other than the concave-convex structure layer, the base substrate, the bonding layer, and the glass substrate may be provided in the concave-convex structure body, and the additional layer may be used as the diffusing section. For example, the additional layer may be formed between the concave-convex structure layer and the substrate film layer, between the bonding layer and the glass substrate, or on the surface of the glass substrate that is toward the luminescent layer (for example, between the glass substrate and an electrode layer of the luminescent layer). Alternatively, the additional layer and one or more of the concave-convex structure layer, the base substrate, the bonding layer, and the glass substrate may be used as the diffusing section.

When the diffusing section is provided as a layer constituting all or part of the concave-convex structure body, no particular limitation is imposed on the degree of diffusion. However, for example, when all or part of the layers from the concave-convex structure layer to the bonding layer serve as the diffusing section, the total light transmittance of the layers from the concave-convex structure layer to the bonding layer wherein the concave-convex surface portion of the concave-convex structure layer is not formed is preferably 70 to 95% and more preferably 73 to 90% because thereby a color unevenness elimination effect can be sufficiently ensured.

Since the surface light source device 2001 of the second invention has the aforementioned features, variations in at least one of x- and y-chromaticity coordinates in all directions in a hemisphere on the light-emitting surface 2040A can be reduced, for example, by half as compared to those which does not have the aforementioned features. Therefore, in the surface light source device 2001, the change in color tone at different viewing angles can be suppressed. To measure the variations in chromaticity in all directions in the hemisphere, for example, a spectral radiance meter is placed on the normal direction with respect to (placed in front of) the light-emitting surface 2040A, and a mechanism for rotating the light-emitting surface from −90 to 90° (the direction of the normal is defined as 0°) is provided. In this manner, the emission spectra can be measured in various directions to calculate the chromaticity coordinates, and the variations in the chromaticity coordinates can thereby be calculated.

In addition, the concave-convex structure layer 2047 formed in the concave-convex structure main body 2044 functions as a light-distribution conversion unit. When the light emitted from the organic EL element 2020 is incident on the concave-convex structure 2041, this light-distribution conversion unit converts the distribution of the incident light so as to reduce the difference between the chromaticity of the light emitted from the light-emitting surface 2040A in the direction normal to the light-emitting surface 2040A and the chromaticity of the light emitted from the light-emitting surface 2040A in an oblique direction crossing the normal direction. Such a concave-convex structure 2041 can control the chromaticity that varies depending on the observation direction, and the diffusing effect by the aforementioned diffusing section can thereby be complemented. Therefore, for example, the amount of the particles added to the layer constituting the diffusing section can be reduced more than that used conventionally. In this manner, this feature enables reduction of the thickness and weight of the layer constituting the diffusing section. Therefore, this feature can contribute to the reduction in thickness and size of the surface light source device 2001.

No particular limitation is imposed on the method of manufacturing the surface light source device 2001 according to the present embodiment. Manufacture of the above exemplified surface light source device having the concave-convex structure body including the concave-convex structure layer, the base substrate, the bonding layer, and the glass substrate may be performed as follows. The layers constituting the organic EL element may be formed on one surface of the glass substrate. Before or after the formation of these layers, the concave-convex structure main body may be attached to the other surface of the glass substrate via a bonding layer. The surface light source device may thereby be manufactured.

The concave-convex structure main body may be manufactured by preparing a mold such as a metal mold having a desired shape, and transferring this shape to the layer of a material for forming the concave-convex structure layer. More specific examples of the method may include Method 1 and Method 2 exemplified in the manufacturing method in the description of the first invention.

Each of the lighting device of the second invention and the backlight device of the second invention includes the surface light source device described above. The lighting device of the second invention includes the surface light source device of the second invention as a light source and may further include any optional components such as a member for holding the light source and a circuit for supplying electric power. The backlight device of the second invention includes the surface light source device of the second invention as a light source and may further include any optional components such as a casing, a circuit for supplying electric power, a diffusion plate for making the emitted light more uniform, a diffusing sheet, and a prism sheet. The applications of the backlight device of the second invention include display devices, such as liquid crystal display devices, for displaying images by controlling pixels and backlights for display devices, such as signboards, for displaying still images.

<Embodiment 2-2>

A surface light source device according to a second embodiment of the second invention will be described.

Figure 20:
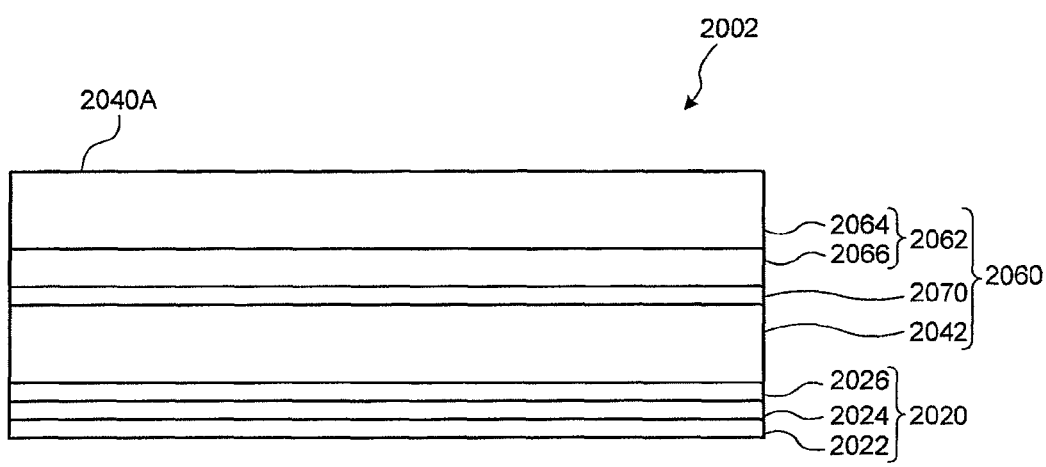
FIG. 20 is a vertical cross-sectional view illustrating a surface light source device according to Embodiment 2-2.

Embodiment 2-2 is the second embodiment according to the second invention. Components that are the same as or that correspond to those in Embodiment 2-1 are denoted by the same reference numerals, and the description will be omitted or simplified. FIG. 20 is a vertical cross-sectional view illustrating the surface light source device according to Embodiment 2-2. As shown in FIG. 20, the surface light source device 2002 according to the present embodiment has a light-emitting surface 2040A having a rectangular shape in a plan view and includes an organic EL element 2020 and a light-emitting-side member 2060 disposed in contact with at least one surface of the organic EL element 2020.

The light-emitting-side member 2060 includes a selective reflecting member 2062, a glass substrate 2042, and a diffusing layer 2070 serving as a diffusing section and disposed between the selective reflecting member 2062 and the glass substrate 2042. The selective reflecting member 2062 includes a substrate film 2064 and a selective reflecting layer 2066 disposed on the surface of the substrate film 2064.

The diffusing layer 2070 is a layer for diffusing the light from the organic EL element 2020. Examples of the material constituting the diffusing layer may include materials containing particles and alloy resin materials having light diffusibility that are formed by mixing two or more types of resins. In terms of facilitating control of light diffusibility, a material containing particles is preferred, and a resin composition containing particles is particularly preferred.

The selective reflecting layer 2066 is a layer having a property that allows specific polarized light in a certain wavelength range to pass therethrough and reflects or absorbs other polarized light. A selective reflection range is a wavelength range in which the selective reflecting layer exhibits the aforementioned properties. The base substrate 2064 may be configured similarly to the base substrate 2045 described above.

Figure 21:
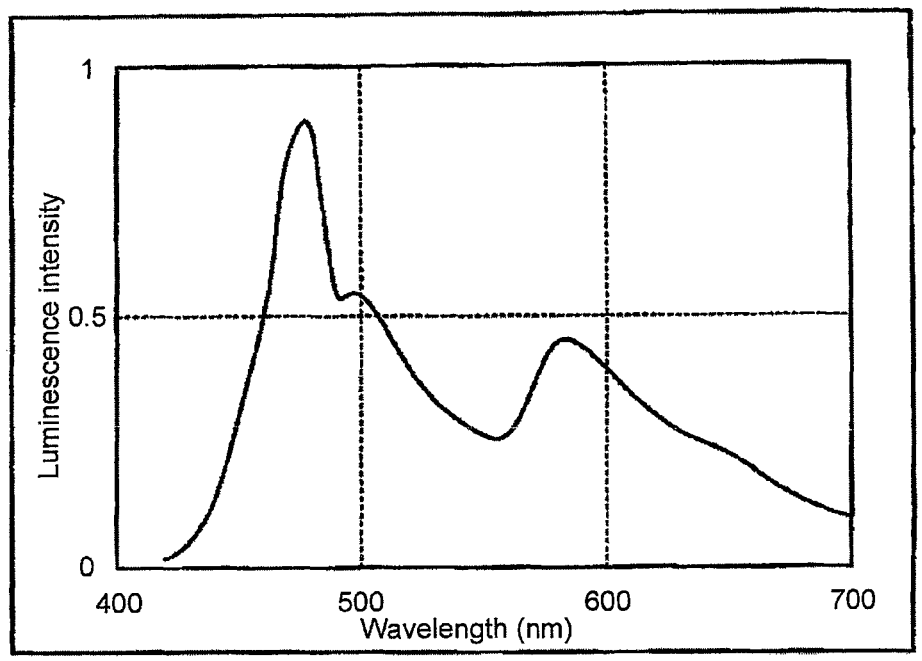
FIG. 21 is a graph showing the spectrum from a luminescent layer used in the surface light source device.

The configuration of the selective reflecting layer 2066 is appropriately selected depending on the intensity peak of the light emitted from the luminescent layer because the selective reflection properties generally vary depending on the wavelength. For example, a luminescent layer having two or more luminescence intensity peaks may be used as the luminescent layer for the present embodiment. Preferably, one or more of the two or more luminescence intensity peaks are in the wavelength range of 500 nm to 650 nm. An example of the spectrum of the light from the luminescent layer having such intensity peaks is shown in FIG. 21. The spectrum shown in FIG. 21 has two peaks at wavelengths of 480 nm and 575 nm. Such two or more luminescence intensity peaks may be obtained by forming the luminescent layer as a stack of a plurality of layers capable of emitting light with different colors or as a mixed layer formed by doping a coloring agent into a layer of another coloring agent.

The selective reflecting layer 2066 has a selective reflection range for transmitted light in the front direction within which range the wavelength of at least one of the aforementioned luminescence intensity peaks falls. An example will be described in conjunction with the spectrum of the luminescent element shown in FIG. 21. The selective reflecting layer may have a selective reflection range for transmitted light in the front direction within which range at least one of wavelengths of 480 nm and 575 nm falls.

The selective reflection range is a wavelength range in which transmittance $(\lambda)[\%]$ satisfies $$\{a-\text{transmittance}(\lambda)\}/\{a-b\} \geq 0.3$$

where a[%] is the maximum transmittance and b[%] is the minimum transmittance in a visible light range from 380 to 780 nm.

Preferably, the selective reflecting layer 2066 has a transmittance $T^F_{Y,N}$ at a wavelength of 575 nm in the front direction, a mean transmittance $T^F_{Y,60}$ at a wavelength of 575 nm in a direction at an angle of 60° with respect to the polar direction, a transmittance $T^F_{B,N}$ at a wavelength of 480 nm in the front direction, and a mean transmittance $T^F_{B,60}$ at a wavelength of 480 nm in a direction at an angle of 60° with respect to the polar direction, all of which satisfy the relationship given by inequality [1]. When the selective reflecting layer 2066 has such a selective reflection range, the change in color tone at different viewing angles can be reduced.

$$(T^F_{Y,60}/T^F_{Y,N}) > (T^F_{B,60}/T^F_{B,N}) \quad [1]$$

More preferably, the selective reflecting layer 2066 has, as the selective reflection range for transmitted light in the front direction, one or more selective reflection ranges lying in the wavelength range of 500 nm to 650 nm. Still more preferably, the selective reflecting layer 2066 has, as the selective reflection range for transmitted light in a direction at an angle of 60° with respect to the polar direction, i.e. in a direction at an angle of 60° with respect to the front direction, one or more selective reflection ranges lying in the wavelength range of 400 nm to 600 nm.

Figure 22:
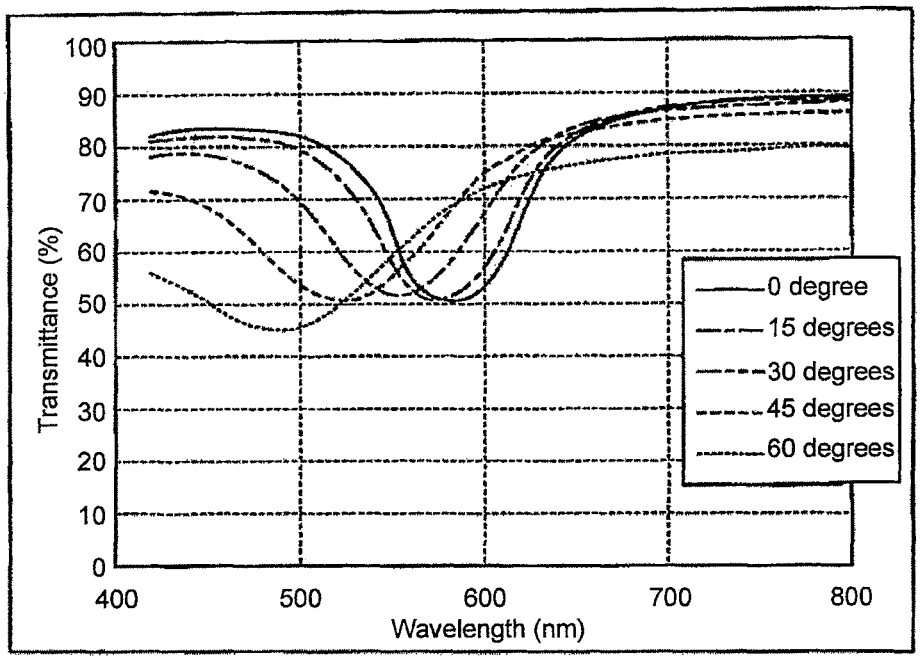
FIG. 22 is a graph showing the selective reflection characteristics of a selective reflecting layer used in the surface light source device according to Embodiment 2-2.

An example of selective reflection characteristics with the selective reflection ranges described above is shown in FIG. 22 in conjunction with the spectrum of the luminescent element shown in FIG. 21. As shown in FIG. 22, in the selective reflection characteristics of the transmitted light at an angle of 0°, i.e. in the front direction, the strongest reflection occurs at a wavelength of 575 nm, and the selective reflection range for the transmitted light in the front direction is not less than 525 nm and not more than 635 nm. As the angle of the transmitted light increases, the maximum absorption wavelength is shifted to a shorter wavelength side. Therefore, the aforementioned inequality [1] is satisfied. In a direction at an angle of 60° with respect to the polar direction, the maximum absorption wavelength is 490 nm, and the selective reflection range is not more than 580 nm.

Figure 23:
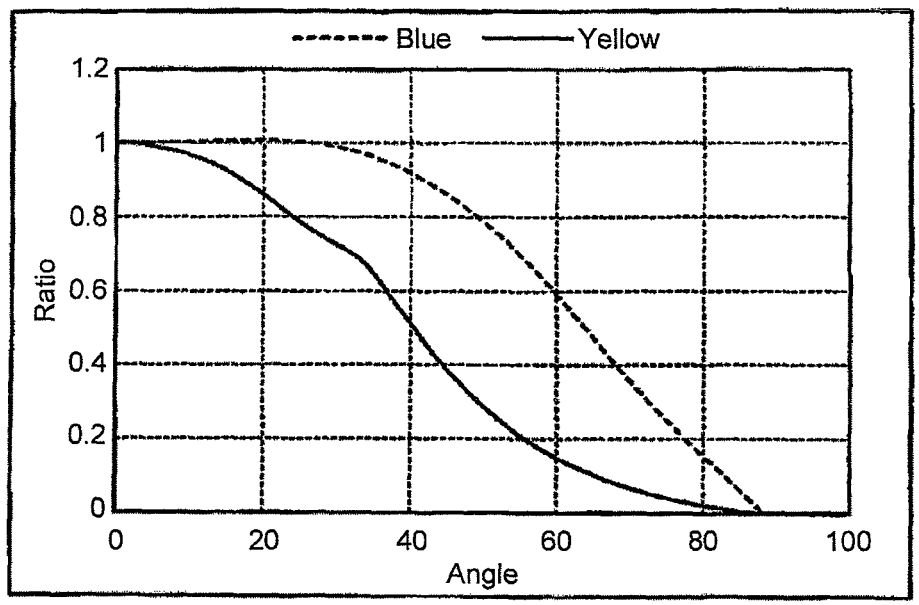
FIG. 23 is a graph showing the distributions of light from a surface light source device used for comparison with the surface light source device according to Embodiment 2-2.
Figure 24:
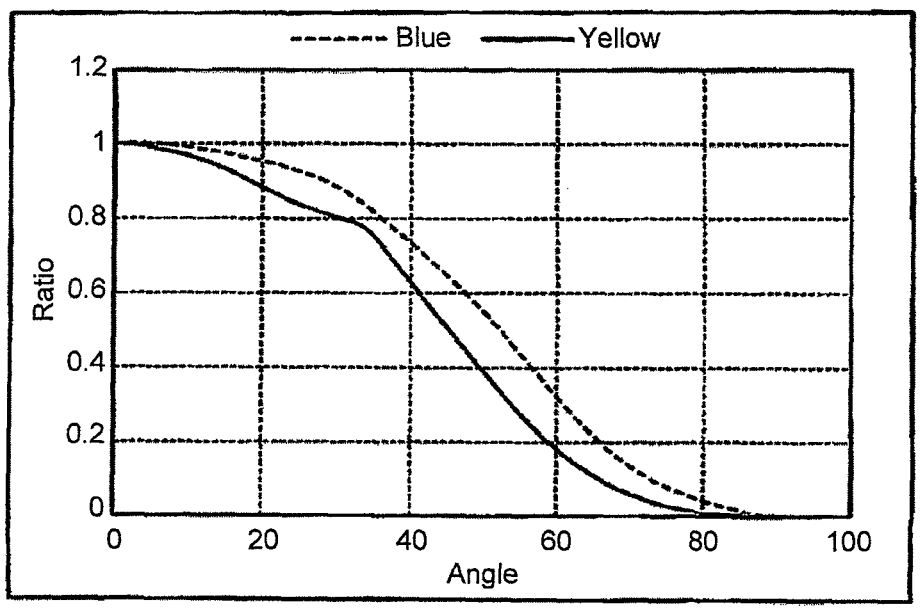
FIG. 24 is a graph showing the distributions of light from a surface light source device used for comparison with the surface light source device according to Embodiment 2-2.
Figure 25:
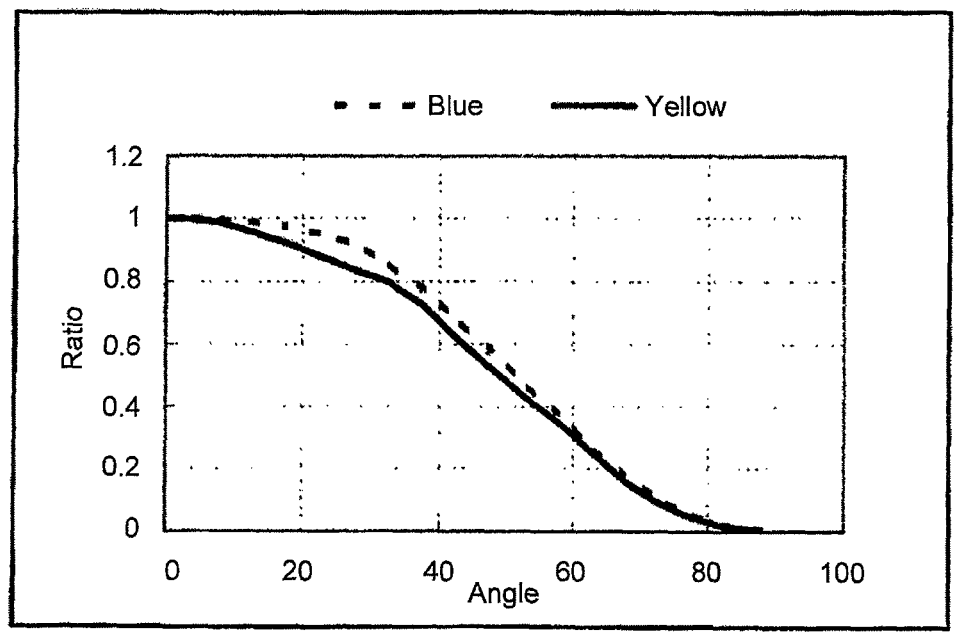
FIG. 25 is a graph showing the distributions of light from the surface light source device according to Embodiment 2-2.

Examples of the suppression of the change in color tone at different viewing angles by the selective reflecting layer 2066 having the aforementioned selective reflection characteristics are shown in FIGS. 23 to 25. FIG. 25 is a graph showing the distributions of blue light having a wavelength of 480 nm and yellow light having a wavelength of 575 nm emitted from the light-emitting surface 2040A of the surface light source device of the second invention shown in FIG. 20. In this instance, the surface light source device includes an element having the spectrum shown in FIG. 21 as the luminescent element and also includes a selective reflecting layer having the selective reflection characteristics shown in FIG. 22 as the selective reflecting layer 2066. FIG. 24 is a graph showing the light distributions of the blue light and yellow light emitted from the glass substrate when the light distributions are observed without the provision of the diffusing layer 2070. FIG. 23 is a graph showing the light distributions when the observation is made with provision of none of the diffusing layer 2070 and the selective reflecting member 2062.

As shown in FIG. 23, the distributions of the blue light and yellow light emitted from the glass substrate 2042 deviate from each other. However, as shown in FIG. 24, the deviation is reduced when the light passes through the selective reflecting member 2062 and is then emitted from the light-emitting surface 2040A. Therefore, the selective reflecting member 2062 functions as a light-distribution conversion unit that converts the distribution of light emitted from the organic EL element 2020 so as to reduce the difference between the chromaticity of the light emitted from the light-emitting surface 2040A in a direction normal thereto and the chromaticity of the light emitted from the light-emitting surface 2040A in an oblique direction crossing the normal direction.

As shown in FIG. 23, the distributions of the blue light and yellow light emitted from the glass substrate 2042 deviate from each other. However, as shown in FIG. 25, the deviation is further reduced when the light passes through the diffusing layer 2070 and the selective reflecting member 2062 and is then emitted from the light-emitting surface 2040A. Therefore, the selective reflecting member 2062 can suppress the color unevenness at different viewing angles, and the diffusing layer 2070 can further suppress the color unevenness. In this manner, the combined use of the selective reflecting member 2062 and the diffusing layer 2070 can further improve the color unevenness elimination effect as compared to the case in which only the diffusing layer 2070 or only the selective reflecting member 2062 is used, and the diffusing layer 2070 can have a reduced diffusing effect. This is advantageous in that the ratio of the amount of diffusing particles etc. added can be reduced and therefore the thickness of the diffusing layer can be reduced.

In the surface light source device 2002 in the present embodiment, a part of the light generated in the luminescent layer 2024 passes directly through the second electrode layer 2026, and another part of the light is reflected on the first electrode layer 2022 and then passes through the second electrode layer 2026. The light that passes through the second electrode layer 2026 passes through the glass substrate 2042, the diffusing layer 2070, the selective reflecting layer 2066, and the substrate film 2064 and is then emitted to the outside. The light reflected on any of the boundaries between the layers from the luminescent layer 2024 to the glass substrate 2042 goes in downward direction in the figure and is then reflected on the first electrode layer 2022 or another boundary, to emit outside. Since the light is emitted through such a variety of paths, interference of light occurs. The increase or decrease of the amount of light caused by the interference varies depending on the wavelength, and therefore the relationship between the viewing angle and the brightness varies depending on the wavelength. This results in a change in color tone at different viewing angles. When such light passes through the aforementioned diffusing layer 2070 and further through the selective reflecting layer 2066 having the aforementioned specific selective reflection characteristics, the change in color tone at different viewing angles may be reduced. In the present embodiment, the selective reflecting layer 2066 is provided on one surface of the substrate film 2064. However, also when the selective reflecting layers 2066 are provided on both surfaces of the substrate film 2064, similar advantages may be obtained.

Any material may be used for the selective reflecting layer 2066, and the selective reflection may be based on any principle, so long as the selective reflecting layer 2066 has the aforementioned selective reflection range. A preferable example of the selective reflecting layer may be a layer including a circular polarization separating sheet. When the selective reflecting layer includes a circular polarization separating sheet, the selective reflecting layer allows only specific circularly polarized light in the selective reflection range to pass therethrough and reflects the remainder of the light (such as the remainder of the circularly polarized light and linearly polarized light).

Examples of the circular polarization separating sheet may include a layer containing a resin having cholesteric regularity. One example thereof may be a circular polarization separating sheet obtained by coating a transparent resin substrate with a composition that can form a cholesteric liquid crystal phase (a cholesteric liquid crystal composition) to obtain a liquid crystal layer and then subjecting the layer to light irradiation and/or heat treatment at least once to cure the composition. As the cholesteric liquid crystal composition, a composition containing a rod-shaped liquid crystal compound that is self-curable or curable with another material may be used. Specific examples of the cholesteric liquid crystal composition may include a rod-shaped liquid crystal compound having a refractive index anisotropy value Δn of 0.10 or larger and including two or more reactive groups in one molecule.

No particular limitation is imposed on the method of manufacturing the cholesteric liquid crystal composition, and the cholesteric liquid crystal composition may be manufactured by mixing the aforementioned essential component and an optional component. Manufacture of the selective reflecting layer using the cholesteric liquid crystal composition may be performed as follows. The substrate film 2064 may be coated with the aforementioned cholesteric liquid crystal composition to obtain a liquid crystal layer, and then the layer is subjected to light irradiation and/or heat treatment at least once to cure the composition.

No particular limitation is imposed on the material for the substrate film 2064, and any substrate having a total light transmittance of 80% or larger at a thickness of 1 mm. Specific examples thereof may include single-layer and stacked films made of synthetic resins such as alicyclic olefin polymers, chain olefin polymers, for example, polyethylene and polypropylene, triacetylcellulose, polyvinyl alcohol, polyimide, polyarylate, polyester, polycarbonate, polysulfone, polyethersulfone, modified acrylic polymers, epoxy resins, polystyrene, and acrylic resins. Of these, alicyclic olefin polymers or chain olefin polymers are preferred. Particularly, alicyclic olefin polymers are preferred because of their transparency, low hygroscopicity, size stability, light weight, etc. As in the diffusing layer 2070, particles that impart light diffusibility may be added to the substrate film 2064. With this configuration, the substrate film 2064 is formed of a composition containing particles that provide light diffusibility and serves also as the diffusing section. This is advantageous in reducing thickness of the diffusing layer 2070.

If necessary, the substrate film may include an orientation film. When the substrate film includes an orientation film, the cholesteric liquid crystal composition applied thereto can be aligned in the desired direction. The orientation film may be of a thickness that is capable to give the liquid crystal layer the desired orientation uniformity, and the thickness is preferably 0.001 to 5 µm and more preferably 0.01 to 2 µm. The liquid crystal composition may be applied to the substrate film by any know method such as reverse gravure coating, direct gravure coating, die coating, or bar coating. If necessary, the coating layer obtained by the application may be subjected to orientation treatment before the coating layer is cured. The orientation treatment may be performed by heating the coating layer at 50 to 150° C. for 0.5 to 10 minutes. The orientation treatment can give precise orientation to the cholesteric liquid crystal layer.

After the optionally performed orientation treatment, the cholesteric liquid crystal composition may be cured, for obtaining a cured liquid crystal layer that is a cured produce of the cholesteric liquid crystal composition. The curing process may be performed as a combination of one or more times of light irradiation and heat treatment. More specifically, the heating may be performed under conditions at a temperature of, for example, 40 to 200° C., preferably 50 to 200° C., and more preferably 50 to 140° C. and for a time period of 1 second to 3 minute and preferably 5 to 120 seconds. In the second invention, the light used for the light irradiation encompasses not only visible light but also ultraviolet light and any other electromagnetic waves. Specifically, the light irradiation may be performed as, for example, irradiation with light having a wavelength of 200 to 500 nm for 0.01 seconds to 3 minutes. For example, irradiation with weak ultraviolet light of 0.01 to 50 mJ/cm$^2$ and heating may be alternately repeated a plurality of times to form a circular polarization separating sheet having a wide reflecting range. After performing the reflecting range expansion by the aforementioned irradiation with weak ultraviolet light etc., the liquid crystal compound may then be completely polymerized by irradiation with relatively strong ultraviolet light of, for example, 50 to 10,000 mJ/cm$^2$ to form a cured liquid crystal layer. The reflecting range expansion and the irradiation with strong ultraviolet light may be performed in air, or all or part of these processes may be performed in an atmosphere with a controlled oxygen concentration (for example, a nitrogen atmosphere).

In the second invention, the number of repetitions of the sequence of the steps of applying the cholesteric liquid crystal composition to the transparent resin substrate and curing the composition is not limited to one. The sequence of application and curing may be repeated a plurality of times to form two or more cured liquid crystal layers.

In the selective reflecting layer described above, the dry thickness of the cured liquid crystal layer is preferably 0.5 µm to 10.0 µm and more preferably 1.0 µm to 5.0 µm. A dry thickness of the cured liquid crystal layer of smaller than 0.5 µm is not preferred because thereby sufficient reflecting performance is not obtained. A dry thickness of larger than 10.0 µm is also not preferred because thereby the amount of light absorption by the cured liquid crystal layer increases. When the cured liquid crystal layer includes two or more layers, the dry thickness is the sum of the thicknesses of these layers. When the cured liquid crystal layer includes only one layer, the dry thickness is the thickness of that one layer.

By the aforementioned process, a stacked structure including the substrate film 2064 and the selective reflecting layer 2066 may be obtained. The stacked structure may be attached to the glass substrate 2042 via the diffusing layer 2070, and the surface light source device 2002 shown in FIG. 20 may thereby be obtained.

As in Embodiment 2-1, each of a lighting device of the second invention and a backlight device of the second invention includes the surface light source device, and the same effects as those in Embodiment 2-1 can be obtained.

<Modifications>

The second invention is not limited to the aforementioned embodiments.

In the configuration of Embodiment 2-1 described above, the concave-convex structure includes concave portions. However, the present invention is not limited thereto, and the concave-convex structure may be configured to include convex portions. When the concave-convex structure is configured to include convex portions, flat portions similar to those described above may be or may not be provided between adjacent convex portions.

In Embodiment 2-1 described above, the shape of the concave portions is a regular quadrangular pyramid shape. However, the shape of the concave portions may be any of polygonal pyramid shapes such as triangular pyramid and octagonal pyramid shapes, a conical shape, truncated polygonal pyramid shapes, a truncated conical shape, a hemispherical shape, a groove shape, and combinations thereof. When the concave-convex structure is configured to include polygonal pyramids or truncated polygonal pyramids, the oblique surfaces of the respective polygonal pyramids need not be strictly flat surfaces and may be formed as curved surfaces with slight fluctuations. When the concave-convex structure is configured to include cones, their generating line is not necessarily a completely straight line, as in the case of the polygonal pyramids, and may be a curved line with slight fluctuations. When polygonal pyramids or cones are employed as any of the concave or convex portions, their apexes may have rounded shapes. When polygonal pyramids or cones are employed, these are not limited to right pyramids or right cones and may be oblique pyramids or oblique cones.

In Embodiment 2-1 described above, all of the plurality of concave portions have the same shape. However, different shapes may coexist. For example, pyramid-shaped concave portions having different sizes may coexist, or pyramid-shaped concave portions and conical concave portions may coexist. Alternatively, concave portions having a shape of a combination of a plurality of pyramids and concave portions having a simple pyramid shape may coexist.

In Embodiment 2-1 described above, the concave portions are aligned in two mutually orthogonal directions. However, the concave portions may be aligned in non-orthogonal directions or in one or three or more directions. In the embodiment, the flat portions are provided between concave portions adjacent in any of the aforementioned two directions. However, the flat portions may be provided in only one direction or may be provided in none of directions. However, the configuration with the flat portions is advantageous in obtaining better light extraction efficiency and also better mechanical strength of the light-emitting surface.

In Embodiment 2-2 described above, a layer containing a resin having cholesteric regularity is used as the selective reflecting layer. However, the present invention is not limited thereto, and the selective reflecting layer may be a dielectric multilayer film. Examples of the dielectric multilayer film may include a band-pass filter formed using $TiO_2$ as a high-refractive index material and $SiO_2$ as a low-refractive index material and showing strong reflecting or transmitting characteristics at specific wavelengths. These selective reflecting layers have a common feature in that the wavelength range having selective reflection characteristics is shifted when the viewing angle is changed. These selective reflecting layers utilize the characteristics that the transmittance of light having a wavelength in the visible range changes in association with the aforementioned shift.

In each of the aforementioned embodiments, the surface light source device may include an optional layer. For example, a coating layer may be provided on the concave-convex structure layer and the coating layer may define the concave-convex structure of the light-emitting surface. In addition, a sealing substrate may be provided on the surface of the organic EL element that is on the side opposite to the light-emitting surface 2040A.

In each of the aforementioned embodiments, the concave-convex structure body or the selective reflecting member is used as the light-distribution conversion unit. However, the present invention is not limited thereto. For example, a diffraction structure may also be used. A diffraction structure has an ability for diffusing a specific wavelength strongly when an appropriate pitch is selected. Also in this case, a combination with another diffusing layer provides the effect of further reducing color unevenness, as in each of the aforementioned embodiments.

In the aforementioned embodiments, the light-emitting-side member is provided only on one surface of the organic EL element 2020. However, light-emitting-side members may be provided on both sides. In this case, it is preferable that the first electrode layer described above is also formed as a transparent electrode. Examples of this configuration are shown in FIGS. 26 and 27.

Figure 26:
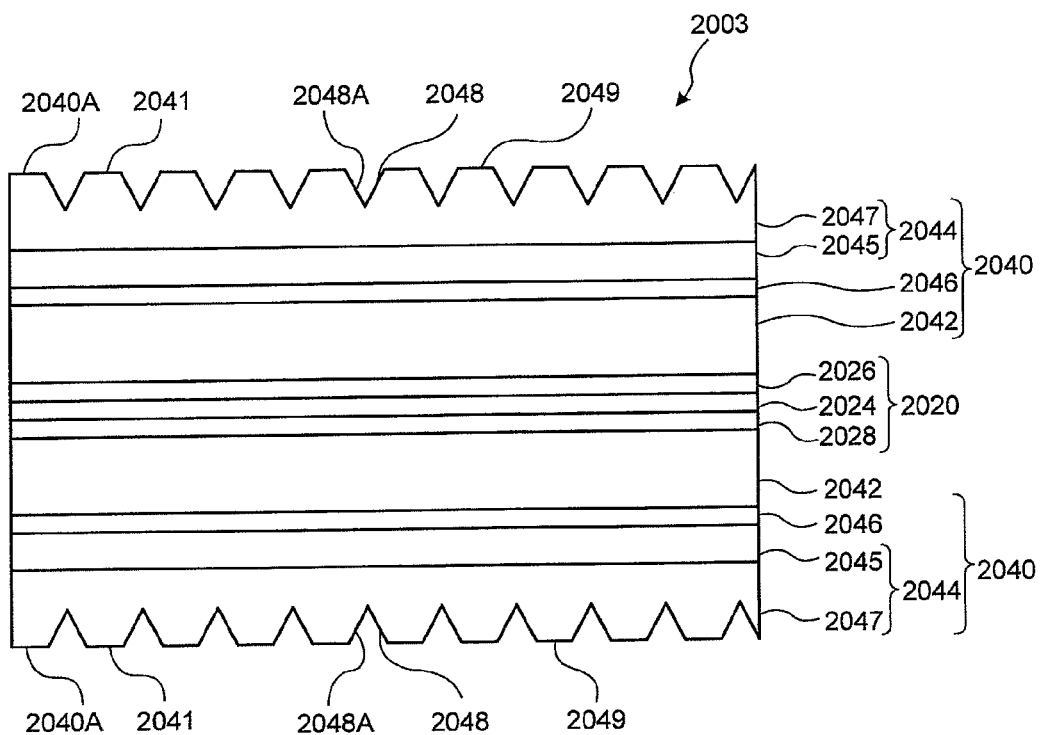
FIG. 26 is a vertical cross-sectional view illustrating a surface light source device according to an embodiment of the second invention.
Figure 27:
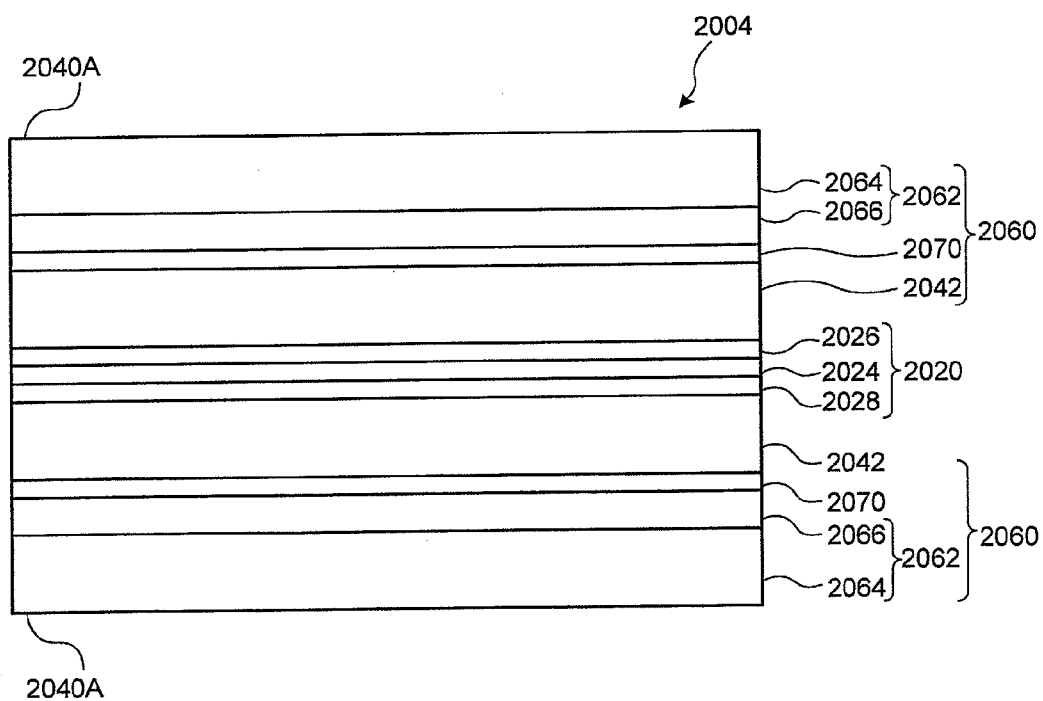
FIG. 27 is a vertical cross-sectional view illustrating a surface light source device according to an embodiment of the second invention.

FIGS. 26 and 27 are vertical cross-sectional views illustrating surface light source devices of embodiments of the second invention. The surface light source device 2003 shown in FIG. 26 is different from the surface light source device in Embodiment 2-1 in that a first electrode 2028 serving as a transparent electrode is provided in place of the first electrode 2022 serving as a reflecting electrode and that concave-convex structure bodies 2040 are provided on both sides of the organic EL element 2020, and the rest of the configuration is the same as that in Embodiment 2-1. The surface light source device 2004 shown in FIG. 27 is different from the surface light source device in Embodiment 2-2 in that a first electrode 2028 serving as a transparent electrode is provided in place of the first electrode 2022 serving as a reflecting electrode and that light-emitting-side members 2060 are provided on both sides of the organic EL element 2020, and the rest of the configuration is the same as that in Embodiment 2-2. An optional material such as a filler or an adhesive agent may be present between the first electrode 2028 and a substrate 2042, or a gap may be present therebetween. In the gap, air or any other gas may be present so long as a problem such as significant deterioration of the durability of the luminescent layer 142 does not occur. Alternatively, the gap may be a vacuum gap.

In each of the surface light source devices 2003 and 2004, the first electrode layer 2028 is a transparent electrode. Therefore, the light from the luminescent layer 2024 passes through the first electrode layer 2028 and the second electrode layer 2026 and is then emitted from the light-emitting surfaces 2040A on the upper and lower sides in the figures. Also in the surface light source devices 2003 and 2004 in which light is emitted from both the front and back surfaces, the same effects as those in Embodiments 2-1 and 2-2 can be obtained.

In each of the surface light source devices 2003 and 2004, the light incident on one of the light-emitting surfaces 2040A generally passes through the surface light source device 2003 or 2004 and is emitted from the other light-emitting surface 2040A. Therefore, the opposite side can be viewed with naked eyes through the surface light source device 2003 or 2004, and the surface light source device can be of a see-through type. This allows diversification of the design.

In the aforementioned examples, identical light-emitting-side members (concave-convex structure bodies 2040 or light-emitting-side members 2060) are disposed on the upper and lower sides in the figures of the surface light source devices 2003 and 2004. However, a combination of different light-emitting-side members may be provided. For example, the concave-convex structure body 2040 may be provided on the surface of the first electrode 2028, and the light-emitting-side member 2060 may be provided on the surface of the second electrode layer 2026.

For example, a layer formed of a composition containing particles that impart light diffusibility may be disposed on the light emitting side of a concave-convex structure layer 2047 or a selective reflecting member 2062, to be used as the diffusing section.

EXAMPLES

The present invention will be described in more detail by way of Examples and Comparative Examples. However, the present invention is not limited to the following Examples. In the following, the refractive indexes of resins used are the refractive indexes after curing.
(Description of Examples and Comparative Examples with Regard to the First Invention)

Comparative Example 1-1

(C1-1: Formation of Organic EL Element and Production of Surface Light Source Device (Without Multi-layered Body))

A transparent electrode layer with a thickness of 100 nm, a hole transport layer with a thickness of 10 nm, a yellow luminescent layer with a thickness of 20 nm, a blue luminescent layer with a thickness of 15 nm, an electron transport layer with a thickness of 15 nm, an electron injection layer with a thickness of 1 nm, and a reflecting electrode layer with a thickness of 100 nm were formed in this order on one principal surface of a glass substrate (refractive index: 1.53) with a thickness of 0.7 mm. All the layers from the hole transport layer to the electron transport layer were formed of organic materials. The yellow luminescent layer and the blue luminescent layer have different luminescence spectra.

The materials for forming the respective layers from the transparent electrode layer to the reflecting electrode layer were as follows.

Transparent electrode layer: tin-doped indium oxide (ITO)
Hole transport layer: 4,4'-bis[N-(naphthyl)-N-phenylamino]biphenyl (α-NPD)
Yellow luminescent layer: α-NPD containing 1.5 wt % of rubrene
Blue luminescent layer: 4,4'-dicarbazolyl-1,1'-biphenyl (CBP) containing 10 wt % of iridium complex
Electron transport layer: phenanthroline derivative (BCP)
Electron injection layer: lithium fluoride (LiF)
Reflecting electrode layer: Al The transparent electrode layer was formed by reactive sputtering with an ITO target, and the surface resistance was 10 Ω/□ or smaller. To form the layers from the hole injection layer to the reflecting electrode layer, the glass substrate having the transparent electrode layer formed thereon was placed in a vacuum deposition apparatus, and the materials for the layers from the hole injection layer to the reflecting electrode layer were successively vapor-deposited by resistance heating. The inner pressure of the system was 5×10⁻³ Pa, and the evaporation rates were 0.1 to 0.2 nm/s.

Wiring leads for supplying an electric current were attached to the electrode layers. The layers from the hole transport layer to the reflecting electrode layer were sealed with a sealing member, to thereby produce a surface light source device (without multi-layered body). The obtained surface light source device had a rectangular light-emitting surface that was capable of emitting white light from the glass substrate side.

(C1-2: Evaluation)

As to the surface light source device obtained in (C1-1), color unevenness at different viewing angles was measured in accordance with the following.

Figure 28:
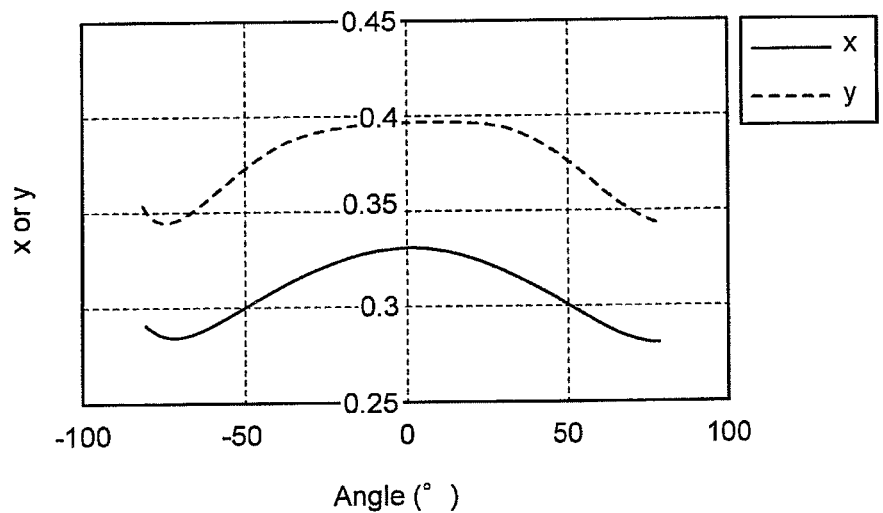
FIG. 28 is a graph showing the relationships between the angle at which chromaticity is measured and the chromaticity values x and Y in the measurement results in Comparative Example 1-1.

A spectral radiance meter (BM-5, product of TOPCON Corporation) was placed in front of (on the normal to) the light-emitting surface (device light-emitting surface). A constant current of 100 mA/m² was applied to the surface light source device, and chromaticity (x, y) was measured while the light-emitting surface was rotated to change the observing direction of the spectral radiance meter with respect to the light-emitting surface. The observation direction was changed in a direction parallel to the long edge of the light-emitting surface in the range of −90 to 90° with respect to the front (normal) direction being set to 0°. The measurement results are shown in FIG. 28. In the observation angle range of ±80°, (Δx, Δy) was (0.050, 0.058). Δx is the amount of change in the coordinate value x, and Δy is the amount of change in the coordinate value y.

Example 1-1

A multi-layered body 110 prepared by the following procedure was attached to the surface light source device obtained in Comparative Example 1-1 to produce the surface light source device schematically shown in FIGS. 1 and 2, and the device was evaluated. Although the organic EL element 140 schematically shown in FIG. 1 includes only three layers, the surface light source device produced in this Example includes an organic EL element having a larger number of luminescent layers.

(1-1: Preparation of Multi-Layered Body 110)

To a UV (ultraviolet) curable resin (urethane acrylate resin, refractive index: n=1.54), a diffusing agent (silicone resin, refractive index n=1.43) being spherical particles having a mean diameter of 2 μm was added in an amount of 10% (volume ratio) based on the total amount of the composition. The mixture was stirred for dispersing the particles. A resin composition was thus obtained.

The obtained resin composition was applied to a substrate film (ZEONOR Film, product of ZEON Corporation, refractive index: 1.53). Then a metal mold having a predetermined shape was pressed against the coating layer of the resin composition, and the resin composition was irradiated with ultraviolet rays from the substrate film side at a cumulative light quantity of 1000 mJ/cm², to form a concave-convex structure layer on the substrate film, to thereby obtain a multi-layered body 110 that was a rectangular film with a layer structure of (the substrate film layer 112)-(the concave-convex structure layer 111).

In the multi-layered body 110, the concave-convex structure on the concave-convex structure layer 111 was composed of a plurality of concave portions 113 having a regular quadrangular pyramid shape and flat portions 114 disposed around the concave portions, as shown in FIGS. 3 and 4. The angles (such as 11L and 11M) between the flat portions and the oblique surfaces constituting the concave portions 113 were 60°. The length of the base edges (11E to 11H) of the concave portions 113 was 16 μm. The spacings 11J and 11K between the concave portions 113 were 4 μm and were constant intervals. The base edges of the concave portions 113 were parallel to the long edge direction or short edge direction of the multi-layered body 110. The thickness of the concave-convex structure layer 111 (the thickness from the flat portions 114 to a plane in contact with the substrate film) was 34 μm, and the thickness of the substrate film layer 112 was 100 μm. The flat portion ratio was 36%.

(1-2: Surface Light Source Device (With Multi-Layered Body))

The multi-layered body 110 obtained in (1-1) was attached to the surface of the glass substrate 131 in the surface light source device obtained in (C1-1) in Comparative Example 1-1 via an adhesive agent (CS9621, acrylic resin, refractive index: 1.49, product of NITTO DENKO Corporation), to thereby obtain a surface light source device having the layer structure of (the multi-layered body 110)-(the bonding layer 121)-(the glass substrate 131)-(the organic EL element 140). The thickness of the bonding layer was 25 μm.

(1-3: Evaluation)

Figure 29:
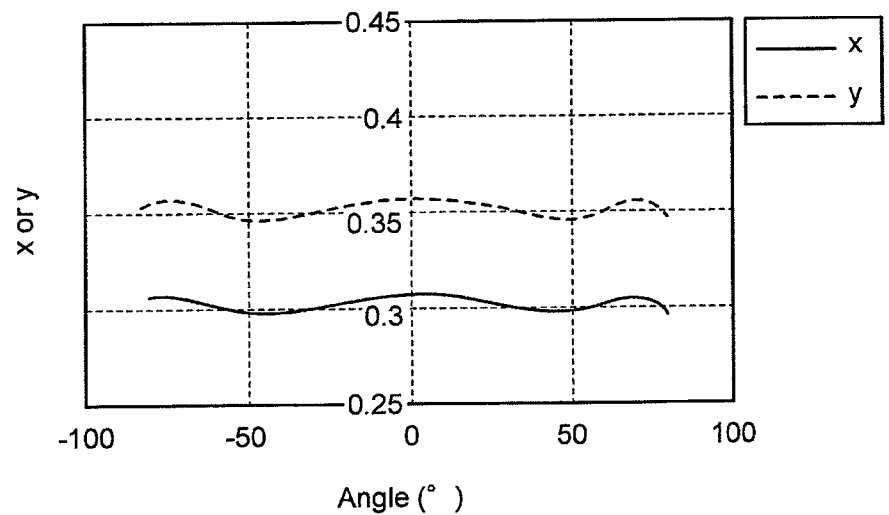
FIG. 29 is a graph showing the relationships between the angle at which chromaticity is measured and the chromaticity values x and Y in the measurement results in Example 1-1.

As to the obtained surface light source device, color unevenness was measured in the same manner as in (C1-2) of Comparative Example 1-1. The results of the determination of x and y values at different viewing angles are shown in FIG. 29. In the viewing angle range of ±80°, (Δx, Δy) was (0.011, 0.013). As can be seen from these results, the color unevenness was significantly reduced as compared to that in Comparative Example 1-1.

Comparative Example 1-2

A multi-layered body 110 was prepared and then a surface light source device was obtained in the same manner as in Example 1-1 except that the diffusing agent for preparing the multi-layered body 110 in (1-1) was not added to the material for the concave-convex structure layer.

<Light Extraction Amount>

The light extraction amount of each of the surface light source devices in Comparative Example 1-1, Example 1-1, and Comparative Example 1-2 was determined from the results of the measurement of the Y value in tristimulus values, and relative amounts with respect to the light extraction amount in Comparative Example 1-1 being set to 1 were determined. As a result, the light extraction amount in Example 1-1 was 1.43 and the light extraction amount in Comparative Example 1-2 was 1.37.

The surface light source device of Example 1-1 had significantly improved light extraction efficiency as compared to the surface light source device of Comparative Example 1-1 having no concave-convex structure for improving light extraction efficiency. The light extraction amount of the surface light source device of Example 1-1 was also improved significantly as compared to that of the surface light source device of Comparative Example 1-2 that had the same concave-convex structure as that of Example 1-1 but had no diffusing member.

Example 1-2

A multi-layered body 110 was prepared and then a surface light source device was obtained in the same manner as in Example 1-1 except for the following modification.

Upon the preparation of the multi-layered body 110 in (1-1), no diffusing agent was added to the material for the concave-convex structure layer. Instead, an adhesive agent was prepared by adding the same diffusing agent as that used in (1-1) to an acid-modified polyolefin resin (COLNOVA MPO-B130C, product of NIHON CIMA Co., Ltd., refractive index: 1.49) in an amount of 10% (volume ratio) based on the total amount of the adhesive agent. This adhesive agent was used in (1-2) in place of the acrylic adhesive agent.

Figure 30:
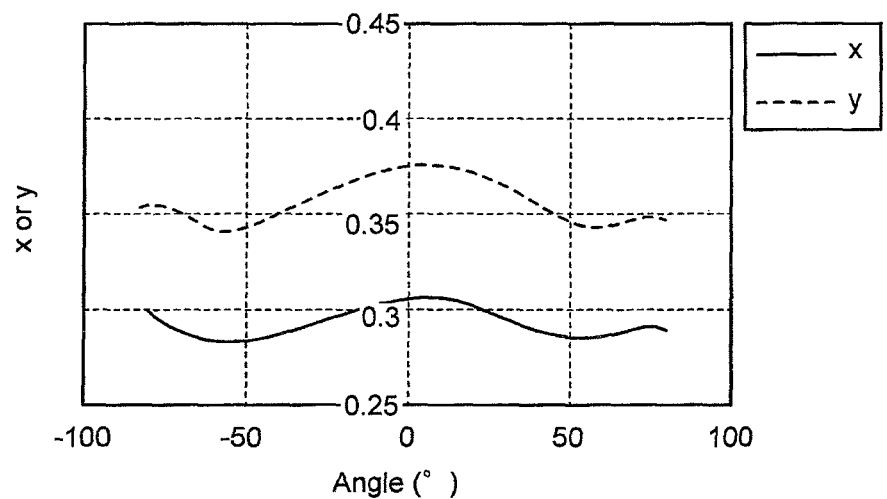
FIG. 30 is a graph showing the relationships between the angle at which chromaticity is measured and the chromaticity values x and Y in the measurement results in Example 1-2.

As to the obtained surface light source device, color unevenness was measured in the same manner as in (C1-2) of Comparative Example 1-1. The results of the determination of x and y values at different viewing angles are shown in FIG. 30. In the viewing angle range of ±80°, (Δx, Δy) was (0.024, 0.034). As can be seen from these results, the color unevenness was significantly reduced as compared to that in Comparative Example 1-1.

Comparative Example 1-3

A multi-layered body 110 was prepared and then a surface light source device was obtained in the same manner as in Example 1-2 except that the diffusing agent for preparing the multi-layered body 110 in (1-1) was not added to the adhesive agent.

As to the obtained surface light source device, color unevenness was measured in the same manner as in (C1-2) of Comparative Example 1-1. The x and y values at different viewing angles were determined. In the viewing angle range of ±80°, (Δx, Δy) was (0.027, 0.041).

Comparative Example 1-4

A multi-layered body was prepared and then a surface light source device was obtained in the same manner as in Example 1-2 except that, upon preparing the multi-layered body 110 in (1-1), irradiation with ultraviolet rays was performed without using the pressing metal mold for forming the concave-convex structure layer. As a result, in place of the concave-convex structure layer, a layer (thickness: 34 μm) made of the same material as that for the concave-convex structure layer but having no concave-convex structure (i.e., a layer with a flat portion ratio of 100%) was formed.

As to the obtained surface light source device, color unevenness was measured in the same manner as in (C1-2) of Comparative Example 1-1. The x and y values at different viewing angles were determined. In the viewing angle range of ±80°, (Δx, Δy) was (0.043, 0.053).

<Light Extraction Amount>

The light extraction amount of each of the surface light source devices in Example 1-2, Comparative Example 1-3, and Comparative Example 1-4 was determined from the results of the measurement of the Y value in the tristimulus values, and relative amounts with respect to the light extraction amount in Comparative Example 1-1 being set to 1 were determined. As a result, the light extraction amount in Example 1-2 was 1.38, the light extraction amount in Comparative Example 1-3 was 1.29, and the light extraction amount in Comparative Example 1-4 was 1.24.

The surface light source device of Example 1-2 had significantly improved light extraction efficiency as compared to the surface light source device of Comparative Example 1-1 having no concave-convex structure for improving the light extraction efficiency. The light extraction amount of the surface light source device of Example 1-2 was also found to be improved significantly as compared to that of the surface light source device of Comparative Example 1-3 having the same concave-convex structure as that of Example 1-2 but having no diffusing member and also to that of the surface light source device of Comparative Example 1-4 having the same diffusing member as that of Example 1-2 but having no concave-convex structure.

Reference Example 1-1

Abrasion Resistance

Several multi-layered bodies with different concave-convex structure shapes were obtained in the same manner as in (1-1) in Example 1-1 except that the shape of the metal mold was changed. The obtained multi-layered bodies had the same shapes of the concave portions, but the spacings 11J and 11K between the concave portions were changed to obtain a variety of flat portion ratios.

Figure 31:
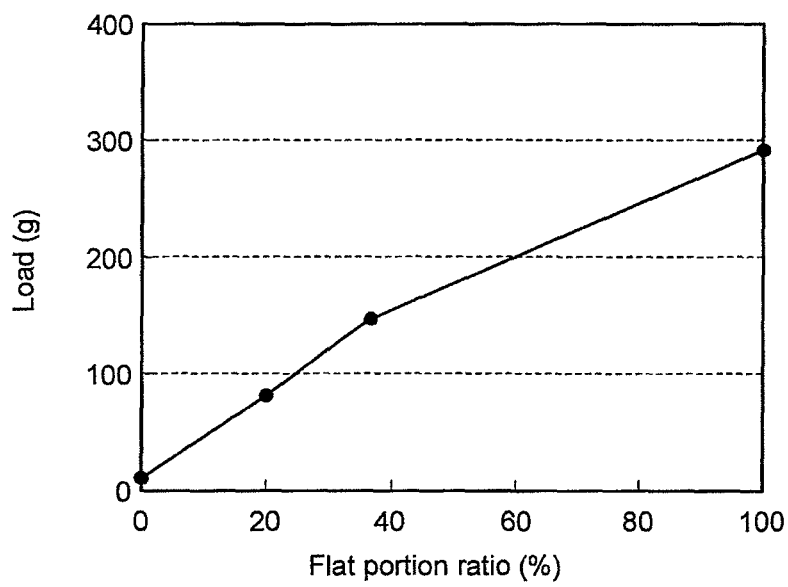
FIG. 31 is a graph showing the relationship between a flat portion ratio and a load in the results of measurement in Reference Example 1-1.

Each of the obtained several multi-layered bodies was placed horizontally. The multi-layered body was vertically pressed against a sapphire needle having a tip end with a diameter of 2 mm with a load applied to the multi-layered body, and was moved in the horizontal direction. Whether or not any scratch was formed by the needle after the movement was visually determined. The load was gradually reduced, and the load (g) at which no scratch was formed was determined. The relationship between the load at which no scratch is formed and the flat portion ratio is plotted in FIG. 31. As can be seen from the results in FIG. 31, the larger the flat portion ratio, the better the abrasion resistance.

Reference Example 1-2

Light Extraction Efficiency (Pyramids)

Light extraction efficiency of a surface light source device was calculated by simulation, assuming that the device consists of an organic EL element and a light-emitting surface structure layer which are as follows.

The organic EL element was assumed to have a luminescent layer, a transparent electrode, and a reflecting electrode. The reflectivity of the reflecting electrode was set to 85%, and the luminescent characteristics of the luminescent layer were assumed to be in accordance with the Lambert distribution.

The light-emitting surface structure layer was assumed to be a plate-like body having a thickness of 20 μm and to consist of a transparent material having a refractive index of 1.53 or a material prepared by adding to the transparent material a diffusing agent having a particle diameter of 2 μm and a refractive index of 1.43 in an amount of 7.5% based on the total volume. The concave-convex structure on the light-emitting surface structure layer was assumed to be a structure of concave portions having a regular quadrangular pyramid shape (vertex angle: 60°, base edges: 20 μm) aligned as in the concave-convex structure layer in FIG. 1. The spacings 11J and 11K between the concave portions were changed so as to cause variety in the flat portion ratio.

Each light-emitting surface structure layer was placed on the transparent electrode-side surface of the aforementioned organic EL element to thereby constitute a surface light source device.

Relative light extraction efficiencies with respect to an instance wherein no diffusing agent was added and the flat portion ratio was 100% being set to 1.00 were determined. The results are shown in Table 1.

TABLE 1

60° pyramid

| Flat portion ratio (%) | Light extraction efficiency (relative value) | |
|---|---|---|
| | Without diffusing agent | With diffusion agent |
| 0 | 1.84 | 1.90 |
| 36 | 1.83 | 1.89 |
| 64 | 1.76 | 1.85 |
| 84 | 1.57 | 1.76 |
| 100 | 1.00 | 1.60 |

Reference Example 1-3

Light Extraction Efficiency (hemispheres)

Light extraction efficiency of a surface light source device was calculated by simulation, assuming that the device consists of an organic EL element and a light-emitting surface structure layer which are as follows.

The organic EL element was assumed to have a luminescent layer, a transparent electrode, and a reflecting electrode. The reflectivity of the reflecting electrode was set to 85%, and the luminescent characteristics of the luminescent layer were assumed to be in accordance with the Lambert distribution.

The light-emitting surface structure layer was assumed to be a plate-like body having a thickness of 20 μm and to consist of a transparent material having a refractive index of 1.53 or a material prepared by adding to the transparent material a diffusing agent having a particle diameter of 2 μm and a refractive index of 1.43 in an amount of 10.0% based on the total volume. The concave-convex structure on the light-emitting surface structure layer was assumed to be a structure of concave portions having a hemispherical shape (diameter: 20 μm) aligned as in the concave-convex structure layer in FIG. 7. The spacing between the concave portions was changed so as to cause variety in the flat portion ratio.

Each light-emitting surface structure layer was placed on the transparent electrode-side surface of the aforementioned organic EL element to thereby constitute a surface light source device.

Relative light extraction efficiencies with respect to an instance wherein no diffusing agent was added and the flat portion ratio was 100% being set to 1.00 were determined. The results are shown in Table 2.

TABLE 2

Hemisphere

| Flat portion ratio (%) | Light extraction efficiency (relative value) | |
|---|---|---|
| | Without diffusing agent | With diffusion agent |
| 10 | 1.90 | 1.91 |
| 27 | 1.89 | 1.91 |
| 49 | 1.84 | 1.87 |
| 77 | 1.66 | 1.78 |
| 100 | 1.00 | 1.60 |

As can be seen from the results in Tables 1 and 2, when the light-emitting surface structure layer contains no diffusing agent, the light extraction efficiency significantly decreases as the flat portion ratio increases. However, when the light-emitting surface structure layer contains the diffusing agent, the significant decrease in light extraction efficiency is suppressed, and therefore high light extraction efficiency and high abrasion resistance can be achieved simultaneously.

Example 1-3

A multi-layered body 110 was prepared and then a surface light source device was obtained in the same manner as in Example 1-1 except that the shape of the metal mold for preparing the multi-layered body 110 in (1-1) was changed. The obtained multi-layered body had almost the same shape of the concave portions as that in Example 1-1. However, the flat portions had flat portions having two different heights as in the flat portions 914 and 915 shown in FIG. 16. The difference in height between the two types of flat portions was 2 μm.

An image reflected from the surface of the obtained surface light source device with electric power turned off was observed. It was observed that the rainbow unevenness was reduced.

[Example for Refractive Index of Bonding Layer]

In the embodiments according to the first invention, the light-emitting surface structure layer is configured to include a multi-layered body including a concave-convex structure layer and a substrate film layer, a glass substrate, and a bonding layer for bonding the multi-layered body and the glass substrate. When the bonding layer is a layer having light diffusibility, it is preferable that the refractive index of a matrix material constituting the bonding layer is larger than the refractive index of a matrix material constituting the bonding surface of the multi-layered body (in this case, the substrate film layer). The term "larger" means that the difference is at least 0.01. The difference is preferably 0.05 or larger and more preferably 0.15 or larger. In such a case, it is preferable that the difference between the refractive index of the glass substrate and the refractive index of the bonding layer is small. The term "small" means that the difference is equal to or smaller than 0.15. The difference is preferably 0.1 or smaller and more preferably 0.05 or smaller. The advantages of such a configuration were calculated by the following simulations.

The aforementioned configuration is applicable not only to the first invention but also to the second invention. More specifically, in the embodiments according to the second invention, the concave-convex structure body is configured to include a substrate made of, for example, glass and disposed on the surface of the second electrode, a concave-convex structure main body, and a bonding layer for bonding the substrate and the concave-convex structure main body.

When the bonding layer is a layer having light diffusibility, it is preferable that the refractive index of a matrix material constituting the bonding layer is larger than the refractive index of a matrix material constituting the bonding surface of the concave-convex structure main body. The term "larger" means that the difference is at least 0.01. The difference is preferably 0.05 or larger and more preferably 0.15 or larger. In such a case, it is preferable that the difference between the refractive index of the glass substrate and the refractive index of the bonding layer is small. The term "small" means that the difference is equal to or smaller than 0.15. The difference is preferably 0.1 or smaller and more preferably 0.05 or smaller.

Example 1-4

Light extraction efficiency of a surface light source device was calculated by simulation, assuming that the device corresponds to those in FIG. 2 and consists of an organic EL element and a light-emitting surface structure layer as follows.

The organic EL element was assumed to have a luminescent layer having a refractive index of 1.9, a transparent electrode also having a refractive index of 1.9, and a reflecting electrode. The reflectivity of the reflecting electrode was set to 100%, and the luminescent characteristics of the luminescent layer were assumed to be in accordance with the Lambert distribution.

The concave-convex structure layer was assumed to be a plate-like body having a thickness of 20 µm and to consist of a transparent material having a refractive index of 1.53, wherein concave portions having a regular quadrangular pyramid shape (vertex angle: 60°, base edges: 20 µm) were aligned at a pitch of 25 µm as in the concave-convex structure layer in FIG. 1.

The substrate film layer was assumed to be a plate-like body having a thickness of 100 µm and a refractive index of 1.53.

The glass substrate was assumed to have a thickness of 500 µm and to consist of a material having a refractive index of 1.7.

As the bonding layers, the following formulations 1 and 2 were simulated.
(Formulation 1) A plate-like body having a thickness of 15 µm. In the material used for the plate-like body in formulation 1, a transparent material having a refractive index of 1.7 was used as a matrix material, and a diffusing agent having a particle diameter of 2 µm and a refractive index of 1.43 was added to the transparent material in a ratio of 30% based on the total volume.
(Formulation 2) A plate-like body having a thickness of 15 µm. In the material used for the plate-like body in formulation 2, a transparent material having a refractive index of 1.53 was used as a matrix material, and a diffusing agent having a particle diameter of 2 µm and a refractive index of 1.43 was added to the transparent material in a ratio of 30% based on the total volume.

In formulation 1, the difference between the refractive index of the matrix material constituting the bonding layer and the refractive index of the material constituting the substrate film layer was 0.17 (=1.7−1.53), and the difference between the refractive index of the matrix material constituting the bonding layer and the refractive index of the material constituting the glass substrate was 0 (=1.7−1.7).

In formulation 2, the difference between the refractive index of the matrix material constituting the bonding layer and the refractive index of the material constituting the substrate film layer was 0 (=1.53−1.53), and the difference between the refractive index of the matrix material constituting the bonding layer and the refractive index of the material constituting the glass substrate was 0.17 (=1.7−1.53).

In the aforementioned configurations, relative light extraction efficiencies with formulation 1 and formulation 2 were calculated. The light extraction efficiency with formulation 1 was 1.3 times the light extraction efficiency with formulation 2. As can be seen from these results, the aforementioned configuration realizes a further improvement of the light extraction efficiency.

DESCRIPTION OF EXAMPLES AND COMPARATIVE EXAMPLES IN SECOND INVENTION

Comparative Example 2-1

(C1-1: Production of Organic EL Element and Production of Surface Light Source Device)

A surface light source device was produced in the same manner as in Comparative Example 1-1. The obtained surface light source device is referred to as a surface light source device A. The surface light source device A had a rectangular light-emitting surface capable of emitting white light from the glass substrate side.
(C1-2: Evaluation)

As to the obtained surface light source device A, color unevenness at different viewing angles was measured in the same manner as in Comparative Example 1-1.

In the viewing angle range of ±80°, ($\Delta x$, $\Delta y$) was (0.050, 0.058).

In the second invention, the color unevenness of the surface light source device is evaluated based on the difference in chromaticity. The criterion of judgment of the difference in chromaticity is ($\Delta x$, $\Delta y$)=(0.025, 0.025) or lower because no practical problem occurs under this criterion.

Example 2-1

A concave-convex structure main body 2044 prepared by the following procedure was attached to the surface light source device A obtained in Comparative Example 2-1 to produce the surface light source device schematically shown in FIG. 19, and the device was evaluated. Although the organic EL element schematically shown in FIG. 19 includes only three layers, the surface light source device produced in this Example includes an organic EL element having a larger number of luminescent layers.
(1-1: Production of Concave-Convex Structure Main Body 2044)

To a UV (ultraviolet) curable resin (urethane acrylate resin, refractive index: n=1.54), a diffusing agent (silicone resin, refractive index n=1.43) being spherical particles having a mean diameter of 2 µm was added in an amount of 10% (volume ratio) based on the total amount of the composition. The mixture was stirred for dispersing the particles. A resin composition was thus obtained.

The obtained resin composition was applied to a substrate film (ZEONOR Film, product of ZEON Corporation). Then a metal mold having a predetermined shape was pressed against the coating layer of the resin composition, and the resin composition was irradiated with ultraviolet rays from the substrate film side at a cumulative light quantity of 1000 mJ/cm$^2$, to form a concave-convex structure layer on the substrate film, to thereby obtain a concave-convex structure main body 2044 that was a rectangular film with a layer structure of (the substrate film)/(the concave-convex structure layer).

In the concave-convex structure main body 2044, the concave-convex structure 2041 on the concave-convex structure layer 2047 was composed of a plurality of concave portions having a regular quadrangular pyramid shape and flat portions disposed around the concave portions. The angles between the flat portions and the oblique surfaces constituting the concave portions were 60°. The length of the base edges of the concave portions was 16 μm. The spacings between the concave portions were 4 μm and were constant intervals. The base edges of the concave portions were parallel to the long edge direction or short edge direction of the concave-convex structure main body 2044. The thickness of the concave-convex structure layer 2047 (corresponding to the thickness of the diffusing section) was 34 μm, and the thickness of the substrate film 2045 was 100 μm. The flat portion ratio was 36%.

(1-2: Production of Surface Light Source Device)

The concave-convex structure main body 2044 was attached to the glass substrate of the surface light source device obtained in Comparative Example 2-1 via an adhesive agent (CS9621, acrylic resin, refractive index: 1.49, product of NITTO DENKO Corporation) to obtain a surface light source device B. The thickness of the bonding layer 2046 was 25 μm.

(1-3: Evaluation)

As to the obtained surface light source device B, color unevenness was measured in the same manner as in Comparative Example 2-1. In the viewing angle range of ±80°, (Δx, Δy) was (0.011, 0.013). As can be seen from these results, the color unevenness was significantly reduced as compared to that in Comparative Example 2-1.

Comparative Example 2-2

A concave-convex structure main body 2044 was produced and then a surface light source device C was obtained in the same manner as in Example 2-1 except that the diffusing agent for preparing the aforementioned concave-convex structure main body 2044 was not added to the material for the concave-convex structure layer (i.e., embodiment with no diffusing section). The measurement was then performed in the same manner as described above. In the viewing angle range of ±80°, (Δx, Δy) was (0.028, 0.040). As can be seen from these results, the color unevenness was slightly reduced as compared to that in Comparative Example 2-1.

<Light Extraction Amount>

The light extraction amount of each of the surface light source devices A to C in Comparative Example 2-1, Example 2-1, and Comparative Example 2-2 was determined from the Y value in the tristimulus values calculated based on the measurement results described above, and relative amounts with respect to the light extraction amount in Comparative Example 2-1 being set to 1 were determined. As a result, the light extraction amount in Example 2-1 was 1.43 and the light extraction amount in Comparative Example 2-2 was 1.37. The surface light source device B of Example 2-1 had significantly improved light extraction efficiency as compared to the surface light source device A of Comparative Example 2-1 having no concave-convex structure for improving light extraction efficiency. The light extraction amount of the surface light source device B of Example 2-1 was improved significantly also as compared to that of the surface light source device C of Comparative Example 2-2 that had the same concave-convex structure 2041 as that of Example 2-1 but had no layer for imparting light diffusibility.

Example 2-2

(2-1: Production of Transparent Resin Substrate Film)

Both sides of a film made of an alicyclic olefin polymer (ZEONOR Film, product of ZEON Corporation) were subjected to corona discharge treatment. One side of the treated film was coated with a 5% aqueous solution of polyvinyl alcohol using a #2 wire bar. The coating layer was dried to form an orientation film having a thickness of 0.1 μm. Then the orientation film was subjected to rubbing processing to prepare a transparent resin substrate film including the orientation film.

(2-2: Formation of Cured Liquid Crystal Layer)

A cholesteric liquid crystal composition for forming a cured liquid crystal layer was prepared with the following composition.

Ratio of solids: 40% by weight

Liquid crystal compound (rod-shaped liquid crystal compound with Δn (ne−no))=0.13): 95.70 parts by weight Photo-polymerization initiator (product name: IRG907, product of Ciba Specialty Chemicals): 3.1 parts by weight Surfactant (product name: KH-40, product of AGC SEIMI CHEMICAL Co., Ltd.): 0.11 parts by weight Chiral agent (product name: LC756, product of BASF): 4.03 parts by weight Solvent methyl ethyl ketone: 154.82 parts by weight The cholesteric liquid crystal composition was applied using a #4 wire bar to the surface of the transparent resin substrate film prepared in (2-1) having the orientation film, said surface having the orientation film formed thereon. The coating layer was dried at 100° C. for 5 minutes for orientation and ripening. Then the coating layer was irradiated with ultraviolet rays at 1.0 mJ/cm² (UV-A: 365 nm±5 nm), held at 100° C. for 1 minute, and then irradiated with ultraviolet rays at 500 mJ/cm² to cure the coating layer. A circular polarization separating sheet in which a selective reflecting layer having a dry thickness of 2 μm was disposed on the substrate film via the orientation film was thereby produced. The reflection spectrum of the obtained circular polarization separating sheet was measured using a spectrophotometer (JASCO V-550, product of JASCO Corporation). The circular polarization separating sheet had selective reflection characteristics shown in FIG. 22.

(2-3: Production of Organic EL Element)

An organic EL element including a second electrode layer, a luminescent layer, and a first electrode layer was disposed on one surface of a glass substrate having a thickness of 1.1 mm to obtain a surface light source device E. At this stage, an electric current was applied to the organic EL element in the surface light source device E, and the distributions of blue light having a wavelength of 480 nm and yellow light having a wavelength of 575 nm emitted from the glass substrate were measured. The results shown in FIG. 23 were obtained. As to the obtained surface light source device E, color unevenness was measured in the same manner as in Comparative Example 2-1. In the viewing angle of ±80°, (Δx, Δy) was (0.129, 0.128).

(2-4: Preparation of Diffusing Layer)

To an acid-modified polyolefin resin (refractive index: 1.49, COLNOVA MPO-3130C, product of NIHON CIMA Co., Ltd.), the same diffusing agent as that used in (1-1) of Example 2-1 was added in an amount of 20% (volume ratio)

based on the total amount of the adhesive agent, to prepare an adhesive agent (diffusing layer).

(2-5: Production of Surface Light Source Device)

The adhesive agent prepared in (2-4) was applied to the other surface of the glass substrate to a thickness of 30 μm (the adhesive agent layer acts as the diffusing section), and then the circular polarization separating sheet was attached thereto so that the selective reflecting layer faces the adhesive agent, to produce a surface light source device D having the structure shown in FIG. 20. An electric current was applied to the obtained surface light source device D, and the distributions of blue light having a wavelength of 480 nm and yellow light having a wavelength of 575 nm emitted from the light-emitting surface 2040A were measured. The results shown in FIG. 25 were obtained.

(2-6: Evaluation)

As to the obtained surface light source device D, color unevenness was measured in the same manner as in Comparative Example 2-1. In the viewing angle range of ±80°, ($\Delta x$, $\Delta y$) was (0.017, 0.017). As can be seen from these results, the color unevenness was significantly reduced as compared to that in the surface light source device E.

Comparative Example 2-3

A surface light source device F was obtained in the same manner as in Example 2-2 except that the diffusing agent was not added to the adhesive agent in (2-4), and the same measurement as above was performed. In the viewing angle range of ±80°, ($\Delta x$, $\Delta y$) was (0.092, 0.091). As can be seen from these results, the color unevenness was slightly improved as compared to that in the surface light source device E. However, the improvement was not as high as that in the surface light source device D, and the color unevenness elimination effect was not sufficient. An electric current was applied to the obtained surface light source device E, and the distributions of blue light having a wavelength of 480 nm and yellow light having a wavelength of 575 nm emitted from the light-emitting surface were measured. The results shown in FIG. 24 were obtained.

As is clear from the comparison between the results in FIGS. 23 to 25, with the surface light source device of the present invention that includes, in addition to the luminescent element, the diffusing layer (adhesive agent layer) and the circular polarization separating sheet, the difference between the distribution of blue light and the distribution of yellow light is smaller than that in a luminescent element provided without a circular polarization separating sheet or without a diffusing layer, and the change in color tone at different viewing angles is small.

Reference Example 2-1

A description will be given of the evaluation of color unevenness when the concave-convex structure and selective reflecting layer used in the present invention are not provided but a diffusing layer is provided on the light emitting side of the organic EL element. The evaluation was performed with a variation in the amount of diffusing agent added.

To a UV (ultraviolet) curable resin (urethane acrylate resin, refractive index: n=1.54), a diffusing agent (silicone resin, refractive index n=1.43) being spherical particles having a mean diameter of 2 μm was added in an amount of 10% (volume ratio) based on the total amount of the composition. The mixture was stirred for dispersing the particles. A resin composition was thus obtained. The obtained resin composition was applied to the glass substrate of the surface light source device used in Example 2-1 and was cured by irradiation with ultraviolet rays to form a diffusing layer having a predetermined thickness on the surface of the organic EL element. More specifically, the amount of the applied resin composition, for example, was changed to produce three diffusing layers having thicknesses of 30 μm, 50 μm, and 100 μm, respectively. For each of the surface light source devices having these diffusing layers, difference in chromaticity was determined. Separately, diffusing layers were formed on the glass substrates so as to have thicknesses of 30 μm, 50 μm, and 100 μm, and the total light transmittances were measured. The results are shown in Table 3.

TABLE 3

|  |  |  | 1 | 2 | 3 |
|---|---|---|---|---|---|
| Thickness |  | μm | 30 | 50 | 100 |
| Chromaticity | $\Delta x$ |  | — | 0.026 | 0.025 | 0.016 |
| difference | $\Delta y$ |  | — | 0.046 | 0.029 | 0.021 |
| Total light transmittance |  | % | 87 | 81 | 73 |

As shown in Reference Example 2-1, in order to improve the difference in chromaticity to the same extent as that in Examples 2-1 and 2-2 (to meet the pass criterion), the thickness of the diffusing layer must be increased to about 100 μm. However, in each of Examples 2-1 and 2-2, the thickness of the layer constituting the diffusing section is about 30 μm. Therefore, the diffusing section can be in a thin thickness that does not impair productivity and does not hinder a reduction in total thickness.

EXPLANATION OF NUMERALS

10: Surface light source device
10U: Device light-emitting surface
100: Light-emitting surface structure layer
110: Multi-layered body
111: Concave-convex structure layer
112: Substrate film layer
113: Concave portion
114: Flat portion
11A-11D: Oblique surface
11E-11H: Base edge
11P: Apex
121: Bonding layer
131: Glass substrate
140: Organic EL element
141: Electrode layer
142: Luminescent layer
143: Electrode layer
146: Electrode layer
151: Sealing substrate
20: Surface light source device
20U: Device light-emitting surface
200: Light-emitting surface structure layer
210: Multi-layered body
211: Concave-convex structure layer
213: Concave portion
214: Flat portion
30: Surface light source device
30U: Device light-emitting surface
300: Light-emitting surface structure layer
310: Multi-layered body
311: Concave-convex structure layer 313: Concave portion
314: Flat portion
40: Surface light source device
40U: Device light-emitting surface
400: Light-emitting surface structure layer
410: Multi-layered body
411: Concave-convex structure layer
413: Concave portion
41T, 41U, 41V: Oblique surface
414: Flat portion
50: Surface light source device
551: Reflecting member
552: Reflecting member substrate
553: Gap
80: Surface light source device
80U: Device light-emitting surface
800: Light-emitting surface structure layer
810: Multi-layered body
811: Concave-convex structure layer
813: Concave portion
814: Flat portion
815: Boundary portion between adjacent concave portions
816: Concave portion
821: Concave-convex structure layer
90: Surface light source device
90U: Device light-emitting surface
900: Light-emitting surface structure layer
910: Multi-layered body
911: Concave-convex structure layer
913: Concave portion
914, 915: Flat portion
1000: Surface light source device
2001, 2002, 2003, 3004: Surface light source device
2020: Organic EL element
2022: First electrode layer
2024: Luminescent layer
2026: Second electrode layer
2028: First electrode layer
2040: Concave-convex structure body
2040A: Light-emitting surface
2041: Concave-convex structure
2042: Substrate
2044: Concave-convex structure main body
2045: Base substrate
2046: Bonding layer
2047: Concave-convex structure layer
2048: Concave portion
2048A: Oblique surface
2049: Flat portion
2060: Light-emitting-side member
2062: Selective reflecting member
2064: Substrate film
2066: Selective reflecting layer
2070: Diffusing layer

The invention claimed is:

1. A surface light source device, comprising: an organic electroluminescent element including a luminescent layer; and a light-emitting surface structure layer disposed in contact with at least one of surfaces of the organic electroluminescent element, wherein:
the light-emitting surface structure layer includes a concave-convex structure provided on a surface thereof on a side toward a light-emitting surface of the device,
the concave-convex structure includes a plurality of concave portions having oblique surfaces and flat portions disposed around the concave portions,
the surface light source device further comprises a first diffusing member and a second diffusing member on which light emitted from the luminescent layer is incident,
the first diffusing member is provided as a layer constituting all or part of the light-emitting surface structure layer, and is a member that allows the incident light to pass through in a diffused manner, and
the second diffusing member is disposed at a position farther from the light-emitting surface structure layer than the organic electroluminescent element, and is a member that reflects the incident light in a diffused manner.

2. The surface light source device according to claim 1, wherein the first diffusing member is a bonding layer interposed between two layers included in the light-emitting surface structure layer.

3. The surface light source device according to claim 2, wherein the light-emitting surface structure layer includes:
a substrate disposed in contact with the organic electroluminescent element,
a concave-convex structure layer disposed at a position closer to the device light-emitting surface than the substrate, the concave-convex structure layer including the concave-convex structure on a surface thereof, the surface being on a side close to the device light-emitting surface, and
a bonding layer for bonding the substrate and the concave-convex structure layer, and wherein:
the surface light source device includes the bonding layer as the first diffusing member.

4. The surface light source device according to claim 1, wherein the first diffusing member is formed from a material containing particles that impart light diffusibility.

5. The surface light source device according to claim 1, wherein, when the concave-convex structure is observed in a direction perpendicular to the device light-emitting surface, a ratio of an area occupied by the flat portions relative to the sum of the area occupied by the flat portions and an area occupied by the concave portions is 10 to 75%.

6. The surface light source device according to claim 1, wherein the concave portions have a pyramid shape, a conical shape, a shape of part of a sphere, or a shape of a combination thereof,
the plurality of concave portions are aligned on the device light-emitting surface in two or more directions crossing each other, and
spacings are provided between adjacent concave portions in all of the two or more directions, the spacings constituting the flat portions.

7. The surface light source device according to claim 1, wherein the concave portions have a pyramid shape, a conical shape, a shape of part of a sphere, or a shape of a combination thereof,
the plurality of concave portions are aligned on the device light-emitting surface in two or more directions crossing each other, and
spacings are provided between adjacent concave portions in only one of the two or more directions, the spacings constituting the flat portions.

8. The surface light source device according to claim 1, wherein the concave portions have a groove shape,
the plurality of concave portions are aligned in parallel to each other on the device light-emitting surface, and
spacings are provided between adjacent concave portions, the spacings constituting the flat portions.

9. The surface light source device according to claim 3, wherein the concave-convex structure layer comprises an ultraviolent curable resin, and the ultraviolet curable resin has a property wherein a pencil hardness of HB or higher is obtained when a cured layer of the ultraviolet curable resin having a thickness of 7 μm is formed on a base substrate with no concave-convex structure provided therein.

10. The surface light source device according to claim 9, wherein the ultraviolet curable resin is an epoxy-based resin.

11. The surface light source device according to claim 9, wherein the ultraviolet curable resin is an acrylic-based resin.

12. The surface light source device according to claim 9, wherein the ultraviolet curable resin is an urethane acrylate resin.

13. The surface light source device according to claim 9, wherein the ultraviolet curable resin is an ene/thiol-based resin.

14. The surface light source device according to claim 9, wherein the ultraviolet curable resin is an isocyanate-based resin.

* * * * *